United States Patent [19]

Iwasa

[11] Patent Number: 5,814,850
[45] Date of Patent: Sep. 29, 1998

[54] SEMICONDUCTOR DEVICE INCLUDING A CAPACITOR RESPONSIBLE FOR A POWER SUPPLY VOLTAGE TO SEMICONDUCTOR DEVICE AND CAPABLE OF BLOCKING AN INCREASED VOLTAGE

[75] Inventor: Shoichi Iwasa, Tokyo, Japan

[73] Assignee: Nippon Steel Corporation, Tokyo, Japan

[21] Appl. No.: 671,341

[22] Filed: Jun. 27, 1996

[30] Foreign Application Priority Data

Aug. 22, 1995 [JP] Japan .................................. 7-236121

[51] Int. Cl.⁶ .......................... H01L 27/108; H01L 29/76; H01L 29/94; H01L 31/119
[52] U.S. Cl. ............................................. 257/296; 257/315
[58] Field of Search ...................................... 257/296, 315

[56] References Cited

U.S. PATENT DOCUMENTS 5,223,730  6/1993  Rhodes et al. ............................ 257/296
5,442,270  8/1995  Kanehachi ................................ 257/315

FOREIGN PATENT DOCUMENTS 61-218155  of 1986  Japan .

*Primary Examiner*—Stephen Meier
*Attorney, Agent, or Firm*—Pollock, Vande Sande & Priddy

[57] ABSTRACT

A semiconductor device has a memory cell array and a filtering capacitor for suppressing noise in a power supply voltage to the device, both formed with one and the same semiconductor substrate. The memory cell array includes memory cells each having a transfer transistor and an information storage capacitor. The transistor of each memory cell has a pair of source/drain regions formed in an active region defined by first isolation regions in a main surface of the semiconductor substrate. Lead electrodes are formed on the source/drain regions. The information storage capacitor of each cell has a lower electrode formed in an electrical connection with a first one of the pair of source/drain regions, a dielectric film and an upper electrode formed on the dielectric film. The filtering capacitor is formed on a second isolation region also formed at the main surface of the semiconductor substrate and has a dielectric layer including an oxide film and a nitride film. The second isolation region has a structure substantially identical with that of the first isolation regions and is arranged at the same film-formation-step level as that of the first isolation regions.

68 Claims, 21 Drawing Sheets

5,814,850

SEMICONDUCTOR DEVICE INCLUDING A CAPACITOR RESPONSIBLE FOR A POWER SUPPLY VOLTAGE TO SEMICONDUCTOR DEVICE AND CAPABLE OF BLOCKING AN INCREASED VOLTAGE

BACKGROUND OF THE INVENTION

The present invention relates to semiconductor technology, and more particularly to a semiconductor device including a capacitor such as a filtering capacitor, and to a method of manufacturing a semiconductor device.

In a semiconductor memory device such as a DRAM, a filtering capacitor is generally used to suppress noise in a power supply. Refer to JP-A-61-218155 laid open on Sep. 27, 1986, for example. For the filtering capacitor, a MOS type capacitor with a gate oxide film made of a capacitance dielectric film is used. On the other hand, each of the memory cells constituting a memory cell array of a DRAM includes an access transistor or a transfer gate transistor and a storage capacitor, for example.

In the conventional method of manufacturing a semiconductor memory device which includes a filtering capacitor, the filtering capacitor is required to have a higher breakdown voltage than the storage capacitor of each memory cell, and consequently these two types of capacitors are produced in different manufacturing steps. This increases the number of steps in manufacturing of the semiconductor device.

SUMMARY OF THE INVENTION

An object of the present invention is to provide a semiconductor device which includes a capacitor responsible for a power supply voltage to the semiconductor device, without incurring an increase in production cost, and to provide a method of manufacturing a semiconductor device, wherein the capacitor has a high breakdown voltage and a high reliability.

According to one aspect of the present invention, there is provided a semiconductor device comprising: element forming regions in which semiconductor elements at a semiconductor substrate are formed; an isolation region for defining the element forming regions; an isolation structure formed in the isolation region for electrically isolating the semiconductor elements formed in the element forming regions; and a filtering capacitor, formed on the isolation structure, for removing noise in a power supply, the filtering capacitor including a lower electrode formed on the isolation structure, a dielectric layer formed on the lower electrode and having at least an oxide film and a nitride film, and an upper electrode formed on the dielectric layer.

According to another aspect of the present invention, there is provided a method of manufacturing a semiconductor device including an element forming region for forming a semiconductor element on a semiconductor substrate, an isolation region for defining the element forming region, an isolation structure formed in the isolation region, for electrically isolating a semiconductor element formed in the element forming region from the isolation region, and a filtering capacitor, located on the isolation structure, for removing power supply noise, the method comprising the steps of:

1) forming a lower electrode of a filtering capacitor located on the isolation structure, for removing power supply noise;
2) forming a dielectric layer, including an oxide film and a nitride film, on the lower electrode of the filtering capacitor; and
3) forming an upper electrode of the filtering capacitor on the dielectric layer.

DESCRIPTION OF PREFERRED EMBODIMENTS

Figure 1:
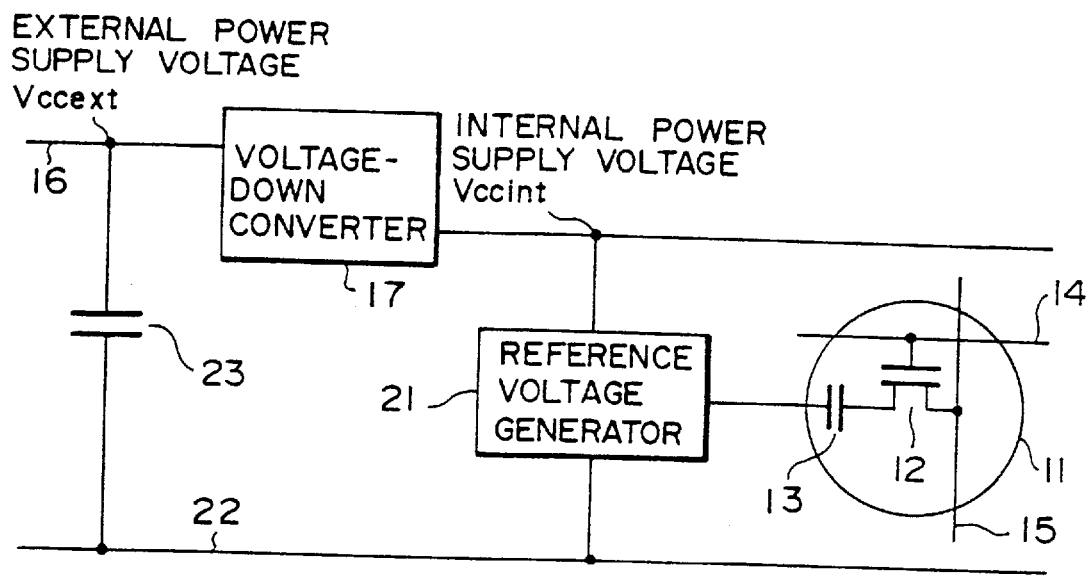
FIG. 1 is an equivalent circuit diagram of a DRAM to which the present invention is applicable.

FIG. 1 is a schematic equivalent circuit diagram of a DRAM having a capacitor for suppressing noise in a power supply voltage, namely, a filtering capacitor.

In FIG. 1, only one memory cell of the memory cell array of the DRAM is shown, and a peripheral circuit of the DRAM is omitted, for convenience of description.

The memory cell 11 of the DRAM has a MOS transistor 12 and a storage capacitor 13, and a word line 14 is connected to the gate electrode of the MOS transistor 12. A storage node electrode, i.e., one of the electrodes of the capacitor 13, is connected to one of the source/drain regions of the MOS transistor 12, and a bit line 15 is connected to the other of the source/drain regions of the MOS transistor 12. The word line 14 is connected to a row decoder of the peripheral circuit (not shown), while the bit line 15 is connected to a sense amplifier and an I/O gate of the peripheral circuit.

In a DRAM with a high integration density, to enhance its reliability by suppressing the short channel effect of a MOS transistor attending on the progressive microminiaturization of the DRAM, an external supply voltage Vccint of normally 5.0V connected to the external power line 16 is not applied directly, but is converted to an internal supply voltage of normally 3.3V by a voltage-down converter 17 and supplied to the internal circuit of the semiconductor device.

A reference voltage (=Vccint/2) is generated by a reference voltage generator 21 from the internal supply voltage Vccint and is applied to the cell plate electrode, that is, the other electrode of the capacitor 13 and is also used to precharge the bit line 15. In a DRAM in which a substrate biasing voltage is applied, to suppress noise in the external power supply line 16, a filtering capacitor 23 is connected between the external power line 16 and the grounding line 22.

As can be seen from FIG. 1, the external supply voltage Vccext is applied across the filtering capacitor 23, while the reference voltage Vccint/2 is applied via the storage capacitor 13 to the MOS transistor 12. Thus, the dielectric film of the filtering capacitor 23 will be subjected to an electric field higher than that to which the dielectric film of the storage capacitor 13.

Therefore, with the progressive thinning of the gate oxide film in accordance with the further miniaturization of the DRAM, if the dielectric film of the filtering capacitor 23 is formed by the same film as the gate oxide film, and when the thickness of the silicon oxide film is about 10 nm (for a 64 Mbit DRAM), for example, the field strength in the dielectric film of the filtering capacitor 23 is as high as 5 MV/cm, and this high field strength obviously poses difficulty in securing high reliability.

Consequently, there has been proposed a structure in which the thickness of the dielectric film of the filtering capacitor, across which the external supply voltage Vccext is applied as mentioned above, differs from the thickness of the gate oxide film of the MOS transistor 12 to which the reference voltage of Vccint/2 is applied. However, this structure results in an increase in the number of manufacturing steps and in the manufacturing cost.

Figure 2A:
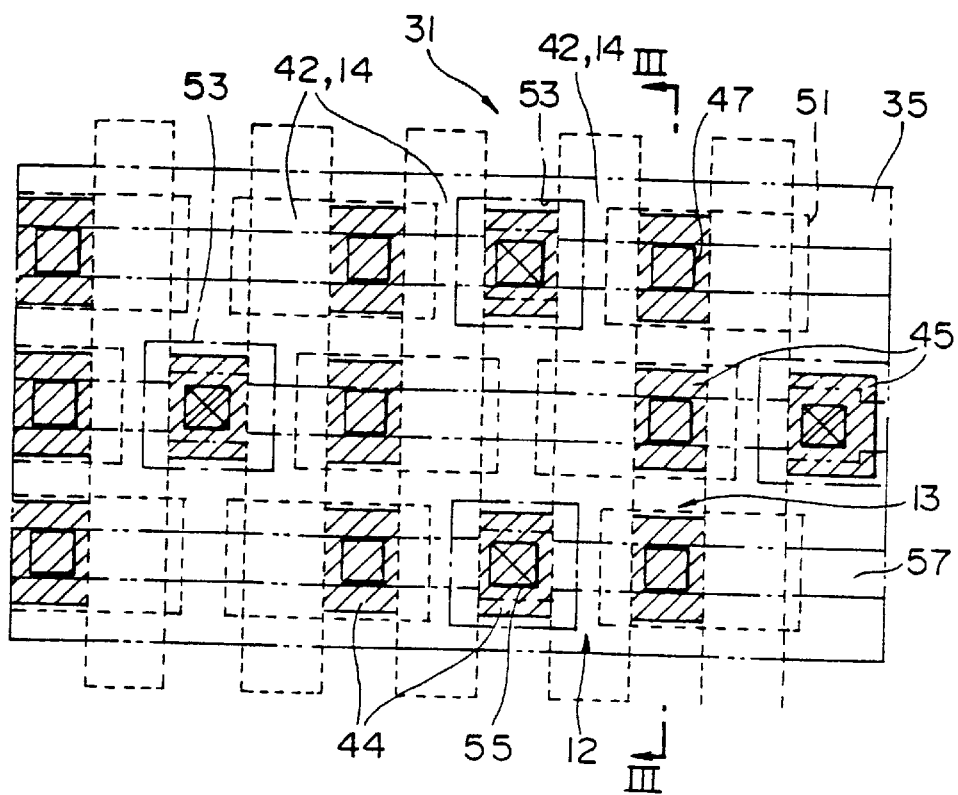
FIGS. 2a and 2b are plan views of a memory array section and a filtering capacitor section of a DRAM according to an embodiment of the present invention.
Figure 2B:
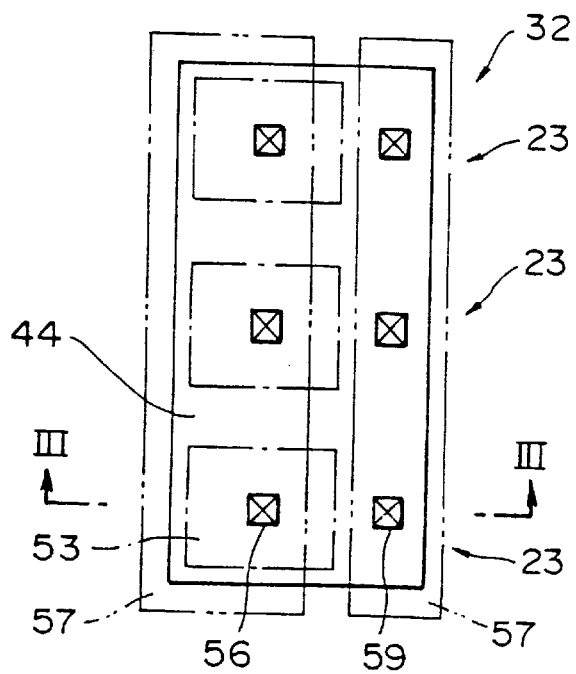
Figure 3:
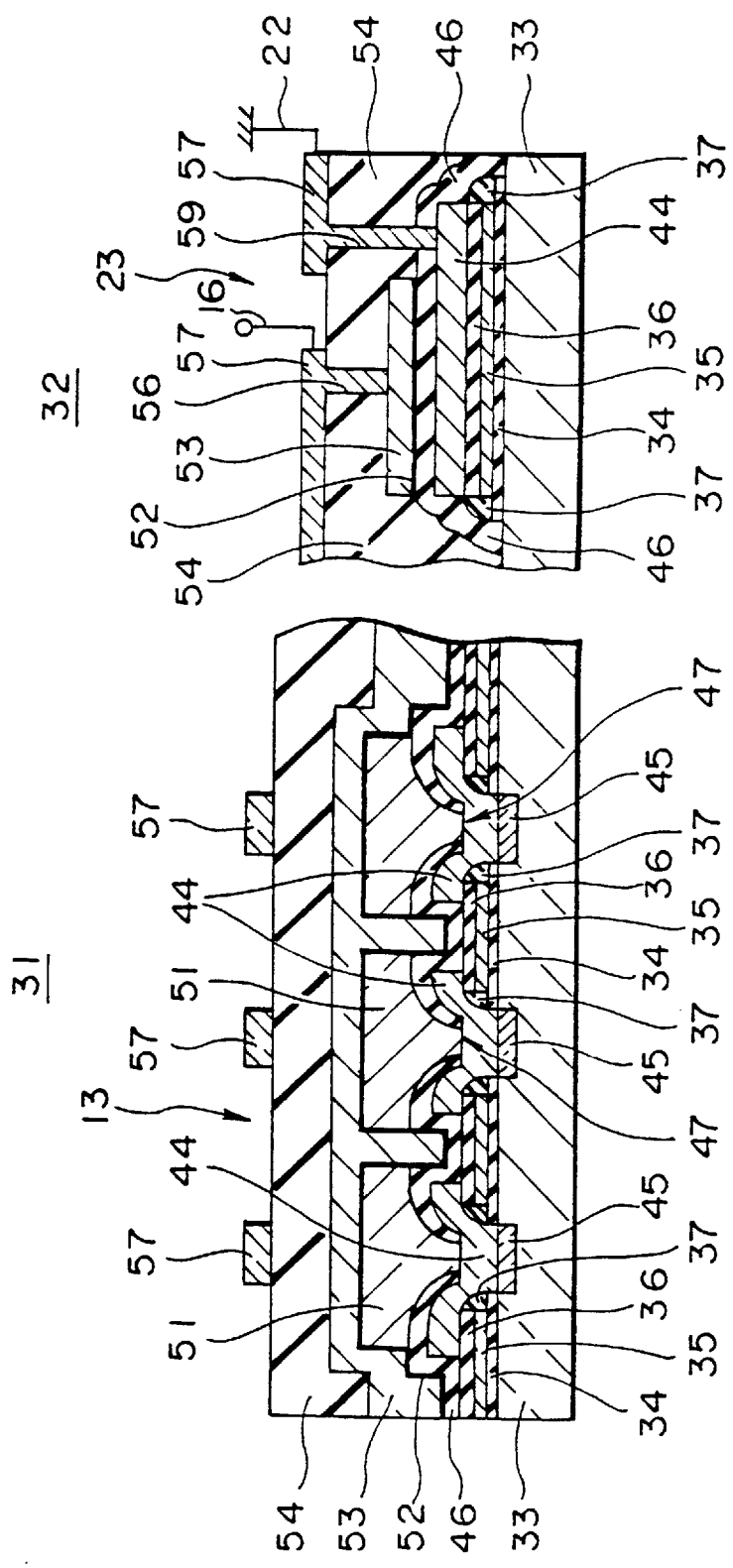
FIG. 3 is a sectional view taken along lines III—III of FIGS. 2a and 2b.

FIGS. 2a, 2b and 3 are plan views and a sectional view of a memory cell array section and a filtering capacitor section of a semiconductor device, for example, a semiconductor memory device such as a DRAM. The DRAM shown by those figures has a folded bit line structure and adopts a field shield structure for isolation.

FIGS. 2a and 2b are plan views of the memory cell array section 31 and the filtering capacitor section 32 of a DRAM, and FIG. 3 is a sectional view taken along lines III—III in FIGS. 2a and 2b. The equivalent circuit of this embodiment is the same as that already described with reference to FIG. 1. The memory cell array section 31 and the filtering capacitor 32 may be formed on one and the same chip.

As shown in FIGS. 2a and 3 depicting the memory cell array 31 of the DRAM, each memory cell has an active device such as a MOS transistor 12 formed at a main surface of the semiconductor substrate 33 and a storage capacitor 13. A MOS transistor 12 has a polysilicon film 42 as a gate electrode and a pair of impurity-diffused layers 45 as source/drain regions with the gate electrode placed therebetween. The MOS transistors 12 are isolated from one another in field shield isolation by a polysilicon film 35 which is kept at a fixed potential.

The capacitor 13 has a polysilicon film 51 as a lower electrode, a polysilicon film 53 as an upper electrode, and a dielectric film, for example, an ONO film (silicon oxide film/silicon nitride film/silicon oxide film) 52 (See FIG. 3). The polysilicon film 51 as the lower electrode is connected to one of the pair of impurity diffused layers 45 through a contact window (for storage node contact) 47 formed in a silicon oxide film 46 (See FIG. 3) on a polysilicon film 44 serving as an electrode (pad electrode). The other of the pair of impurity diffused layers 45 is connected to a polysilicon film 57 as a bit line through a contact window (for bit contact) 55 formed in a silicon oxide film (not shown) over the polysilicon film 44.

As shown in FIGS. 2a and 3 depicting the filtering capacitor portion 32 including a capacitor responsible for a supply voltage to the DRAM, each filtering capacitor 23 has a polysilicon film 44 as a lower electrode formed on a field shield isolation structure (34, 35, 36), a polysilicon film 53 as an upper electrode, and a capacitance insulator layer, that is, a dielectric layer formed between the two electrodes 44 and 53. This dielectric layer has a multi-layer structure including a silicon oxide film 46 and an ONO film 52, for example, as shown in FIG. 3.

The polysilicon film 44 as the lower electrode of the filtering capacitor 23 is connected to a grounding line 22, shown in FIG. 1, through a polysilicon 57 filled in a contact window 59 opened in a BPSG film 54 (See FIG. 3) on the lower-electrode polysilicon film 44.

The polysilicon film 53 as the upper electrode of the capacitor 23 is connected to the external power line 16, shown in FIG. 1, through the polysilicon 57 filled in the contact window opened in the BPSG film 54 deposited on the polysilicon film 53.

The field shield structures (34, 35, 36) in the memory cell array section 31 and in the filtering capacitor section 32 are substantially of the same structure, and are arranged at the same film-formation-step level.

The films 44, 52 and 53 in the filtering capacitor section 32 are made of the same materials as those of the films 44, 52 and 53 in the memory cell array section 31 and are arranged at the same film-formation-step levels as the films 44, 52 and 53 in the memory cell array section 31. The same film-formation-step level means a level of films or the like formed by execution of a film formation step and does not always mean the same geometrical level.

As has been described, in the DRAM according to this embodiment, the capacitance insulator layer, that is, the dielectric layer of the filtering capacitor 23 is not formed of the same material and is not formed at the same time as the gate oxide of the MOS transistor 12, but the capacitance insulator layer includes an ONO film 52 composed of silicon oxide films and a silicon nitride film, and therefore the defect density of the dielectric layer can be reduced considerably as compared with that of the conventional dielectric film made of silicon oxide. Hence, the life of the filtering capacitor 23 can be prolonged (the integrity can be improved). Since the dielectric layer of the filtering capacitor 23 includes a silicon oxide film 46 in addition to the ONO film 52 and thus can suppress a current leakage, the dielectric strength or the breakdown voltage of the filtering capacitor 23 is further improved.

In the DRAM according to this embodiment, the filtering capacitor, being formed on the field shield isolation structure, is electrically isolated from the substrate 33. Therefore, the filtering capacitor is kept at a stable potential and operates stably. Accordingly, the filtering capacitor has an improved filtering function.

A method of manufacturing a DRAM according to this embodiment will next be described with reference to FIGS. 3 and 4a to 4h.

Figure 4A:
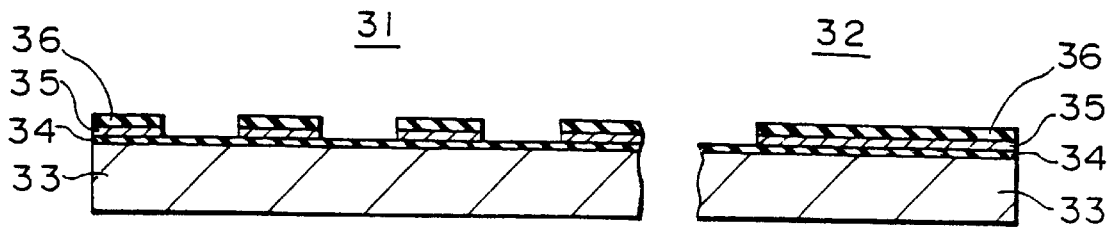
FIGS. 4a to 4h are sectional views showing manufacturing steps of a DRAM according to an embodiment of the present invention.

When manufacturing a DRAM according to this embodiment, as shown in FIG. 4a, a pad silicon oxide film 34 with a thickness of 40 to 50 nm is first formed on a main surface of a p-type silicon substrate 33 having a memory cell array section 31 and a filtering capacitor section 32.

Then, an n-type polysilicon film 35 about 150 nm thick and a cap silicon oxide film 36 are deposited successively by the low-pressure CVD technique. Subsequently, portions of the silicon oxide film 36 and the polysilicon film 35 which are to be made element forming regions or active regions are removed, thus leaving those portions of the films 35 and 36 which are to be made isolation regions.

Figure 4B:
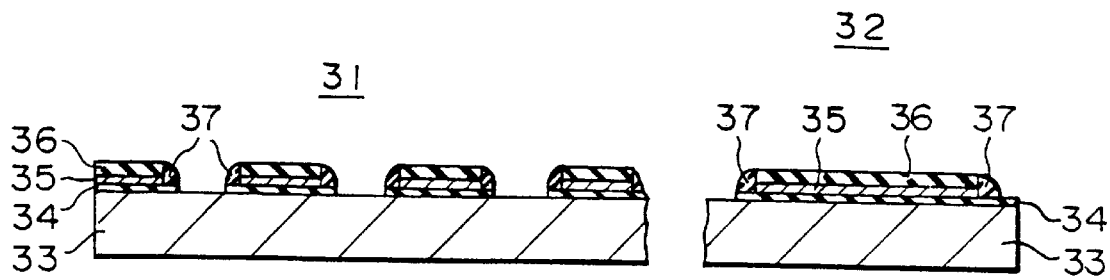

Then, as shown in FIG. 4b, a silicon oxide film about 200 nm thick is deposited by the low pressure CVD technique, and by anisotropic dry etching applied to the whole surface of this silicon oxide film, side walls 37 made of the silicon oxide film are formed on the side surfaces of the polysilicon film 35 and the silicon oxide film 36.

Consequently, isolation regions of a field-shield structure, including the polysilicon film 35, the silicon oxide films 34 and 36 and the side wall 37, are formed with the active regions surrounded by the isolation region. In this embodiment, the filtering capacitor section 32 is formed not on the silicon substrate 33 but on the field-shield isolation structure (34, 35 and 36). The silicon oxide film 34 of the active regions is etched away by over-etching of the silicon oxide film when the side wall 37 is formed. After this, an impurity for controlling the threshold voltage of the MOS transistors 12 is implanted into active regions with the silicon oxide film 36 and the side wall 37 used as the mask, and then a silicon oxide film, not shown, about 10 to 15 nm thick is formed as a gate oxide film on the surface of the active regions by thermal oxidation.

After this, an n-type polysilicon film 42 about 200 nm thick as shown in FIG. 2a is deposited by the low pressure CVD technique on the whole surface of the resulting substrate, and the word lines 14 are formed from this polysilicon film 42.

Further, an n-type silicon oxide film, not shown, about 150 nm thick is deposited on the whole surface of the substrate by the low pressure CVD process, and by etching the silicon oxide film by anisotropic dry etching, the side walls (not shown) made of the above-mentioned silicon oxide film are formed on the side surfaces of the polysilicon film 42 (FIG. 2a). By over-etching of silicon oxide film to form the side walls, the silicon oxide film in the portions other than the regions under the polysilicon film 42 as the word line 14 are removed. These portions of the silicon oxide film serves as gate oxide films of transistors.

Figure 4C:
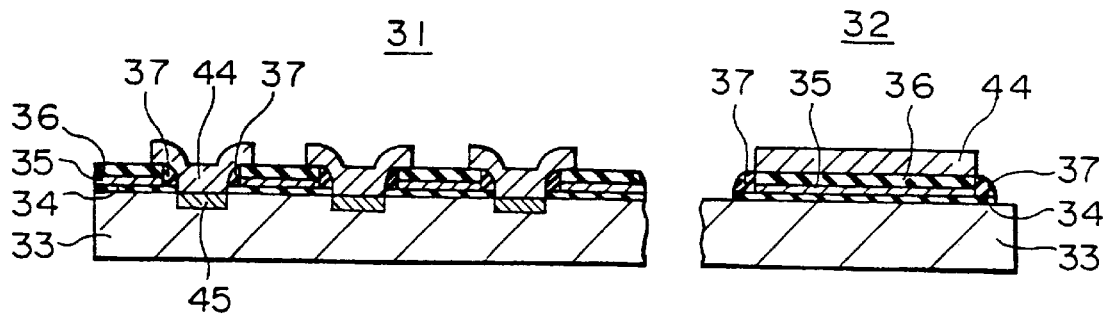

Then, as shown in FIG. 4c, a polysilicon film 44 about 150 nm thick is deposited by the low pressure CVD process on the whole surface of the resulting substrate, and this polysilicon film 44 is etched by anisotropic dry etching to form an electrode pattern in contact with the active regions on both sides of the polysilicon film 42 (the word lines 14) and also to form a lower electrode pattern of the filtering capacitor 23. As a result, some portions of the field-shield structure in the memory cell array section 31 are exposed.

Then, arsenic ions are implanted into the polysilicon film 44, and by heat treatment at 900° C. in a nitrogen atmosphere, the arsenic ions in the patterned polysilicon film 44 are made to diffuse into the silicon substrate 33 of the memory cell array section 31, with which the polysilicon film 44 is in contact, by solid phase diffusion to form a pair of n-type impurity diffused layers 45 as a pair of the source/drain regions for each MOS transistor 12 (only one region of each pair is shown in FIG. 4c, with the other region not shown). By the process up to this stage, MOS transistors are completed.

Figure 4D:
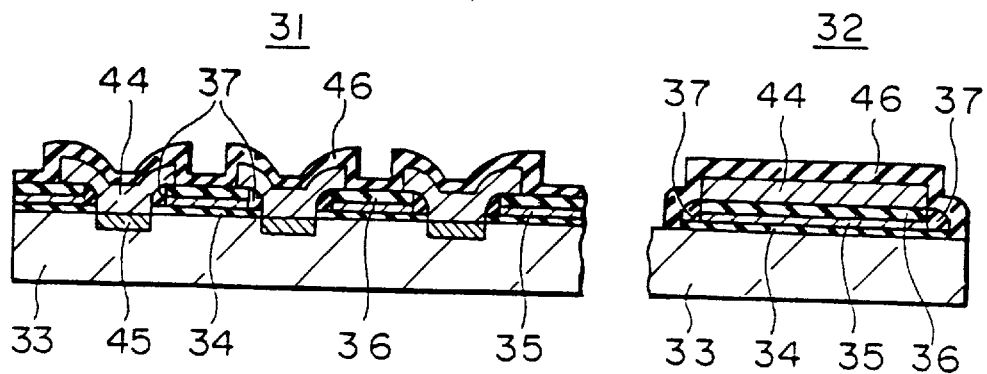
Figure 4E:
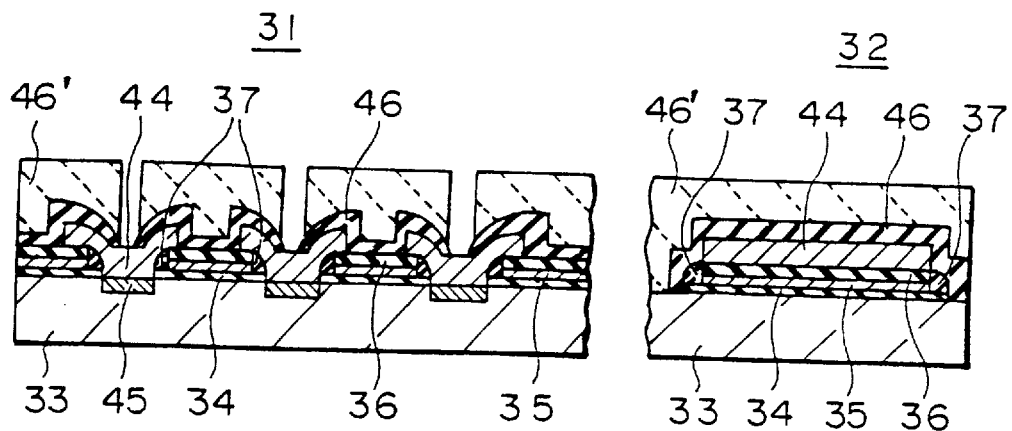

As shown in FIG. 4d, after a silicon oxide film 46 about 20 nm thick is deposited on the whole surface of the resulting substrate including the exposed portion of the isolation structure to provide an insulating film serving as a dielectric layer of the filtering capacitor 23, and as shown in FIG. 4e, by using a photoresist pattern 46', portions of the silicon oxide film 46 which overlie the polysilicon films 44 serving as electrodes of first of pairs of diffusion layers 45 of a MOS transistor are etched away to open contact windows (storage node contacts) for the lower electrodes (i.e., storage node electrodes) of the capacitors 13.

Figure 4F:
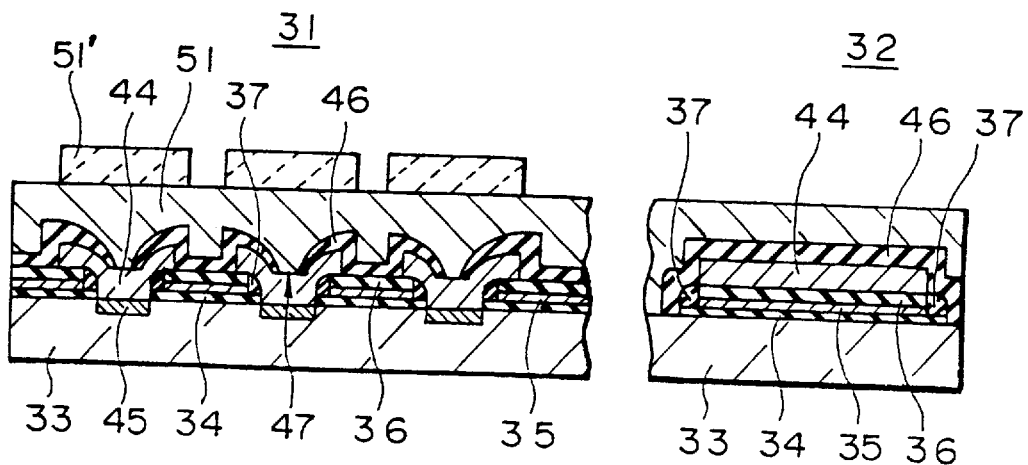
Figure 4G:
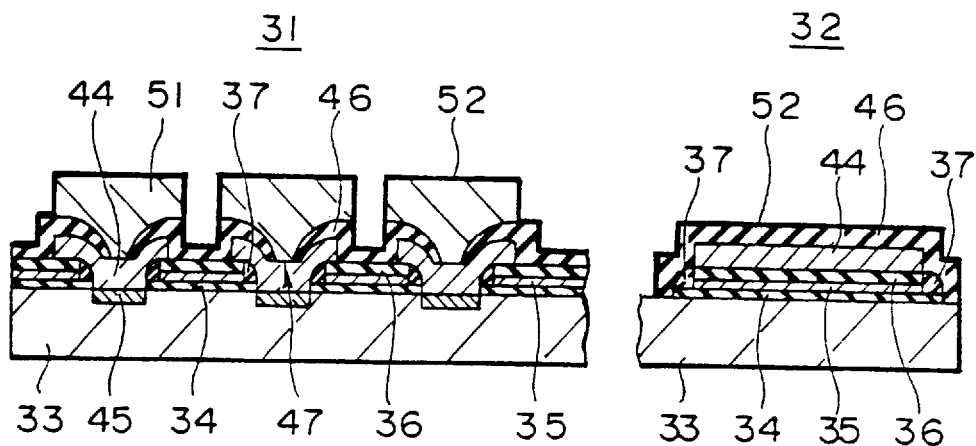

As shown in FIG. 4f, an n-type polysilicon film 51 is deposited on the whole surface of the resulting substrate by the low pressure CVD process, and by using a photoresist pattern 51', this polysilicon film 51 is etched to form a lower electrode pattern of the capacitor 13, and as shown in FIG. 4g, an ONO film 52 with a thickness of about 5 to 6 nm calculated in terms of the thickness of a silicon oxide film is deposited on the whole surface of the resulting substrate.

Figure 4H:
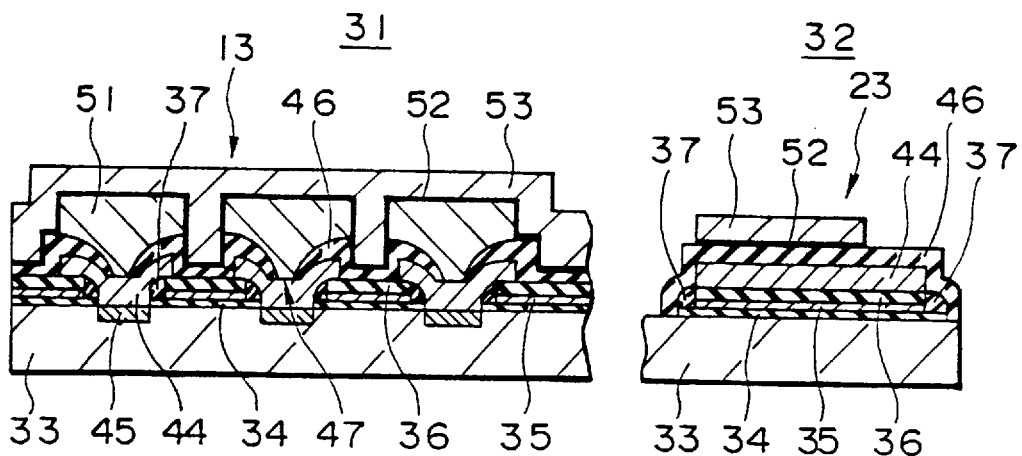

Then, as shown in FIG. 4h, an n-type polysilicon film 53 is deposited on the whole surface of the resulting substrate by the low pressure CVD process, and the polysilicon film 53 is etched to form a cell plate electrode pattern as upper electrodes of storage capacitors 13 and an upper electrode pattern of a filtering capacitor 23. Since the ONO film 52 is thin, the ONO film 52 is also etched by the same patterning for the polysilicon film 53. By the processes up to this patterning step, capacitors 13 of the DRAM memory cells, each having a pair of electrodes formed by the polysilicon films 51 and 53, and the dielectric film made of the ONO film 52 have been completed. At the same time, a filtering capacitor 23 formed by a pair of electrodes of the polysilicon films 44 and 53 and the dielectric layer, which includes the ONO film 52 and the silicon oxide film 46, has also been completed.

As shown in FIG. 3, an interlayer dielectric BPSG film 54 is deposited on the whole surface of the resulting substrate, and the surface of the BPSG film 54 is flattened by reflow by heat treatment at 900° C. Contact windows (bit contact windows) 55 (FIG. 2a) reaching the polysilicon film 44 the electrodes of the second diffusion layers 45 of MOS transistors 12 and contact windows 56, 59 respectively reaching the upper-electrode polysilicon film 53 and the lower-electrode polysilicon film 44 of the filtering capacitor 23 are formed through the BPSG film 54 and other films.

Then, a doped polysilicon film 57 or the like is deposited so as to fill in the contact windows 55, 56 and 59, and is etched to form a pattern of bit lines 15 in the memory cell array section and a pattern of external power line 16 and grounding line 22 in the filtering capacitor section. Strapping conductors are formed for the polysilicon films 42 serving as the world lines 14 by using an aluminum film, not shown, and a surface protective film, not shown, is formed, by which a DRAM according to this embodiment has been completed.

Figure 5A:
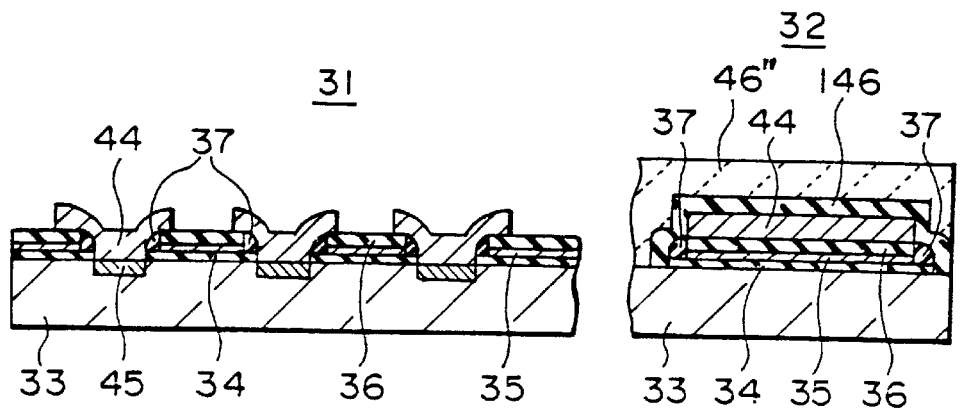
FIGS. 5a to 5c are sectional views showing manufacturing steps of a DRAM according to another embodiment of the present invention.

Modifications of the above embodiment which has been discussed with reference to FIGS. 4a to 4h will now be described with reference to FIGS. 5a to 5c.

The manufacturing steps shown in FIGS. 4a to 4d may be adopted as they are. In FIG. 4a, a portion of the silicon oxide film 46 on the polysilicon film 44 as the electrode of the diffusion layer 45 is etched to form a window for contact of the electrode with the lower electrode of the storage capacitor 13. In this modified embodiment, however, as shown in FIG. 5a, by using a photoresist pattern 46", all of the silicon oxide film 46 in the memory cell array section 31 is removed to make the surface of the electrodes 44 exposed.

Therefore, the step of forming contact windows for the electrodes 44 is not necessary.

Figure 5B:
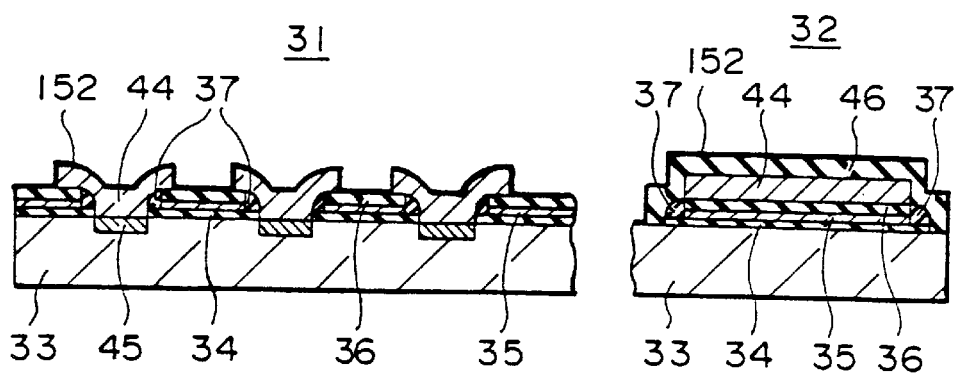

Then, as shown in FIG. 5b, an ONO film 152 is deposited on the whole surface of the resulting substrate like in FIG. 4g.

Figure 5C:
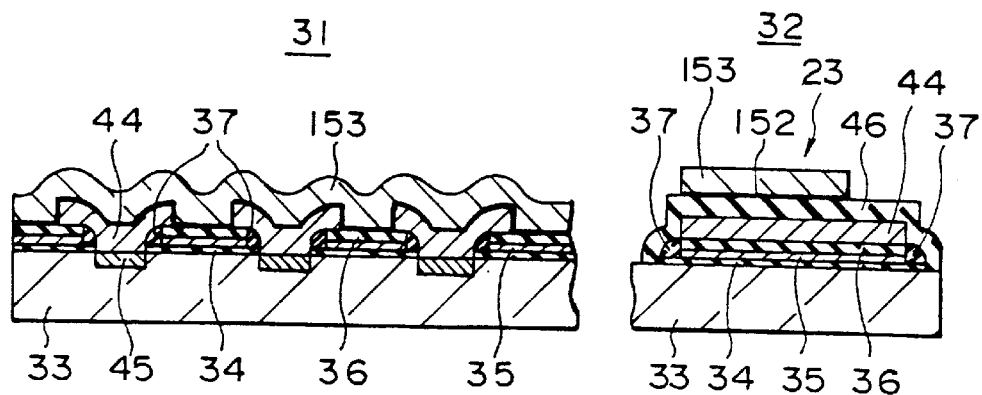

Next, as shown in FIG. 5c, an n-type polysilicon film 153 is deposited by the low pressure CVD process, and the film 153 is etched to form the upper electrode pattern of the storage capacitor 13 and the upper electrode pattern of the filtering capacitor 23. In this patterning, the ONO film 152 is also etched in the same pattern. By the process executed heretofore, the storage capacitors 13 and the filtering capacitor 23 have been completed.

Figure 6:
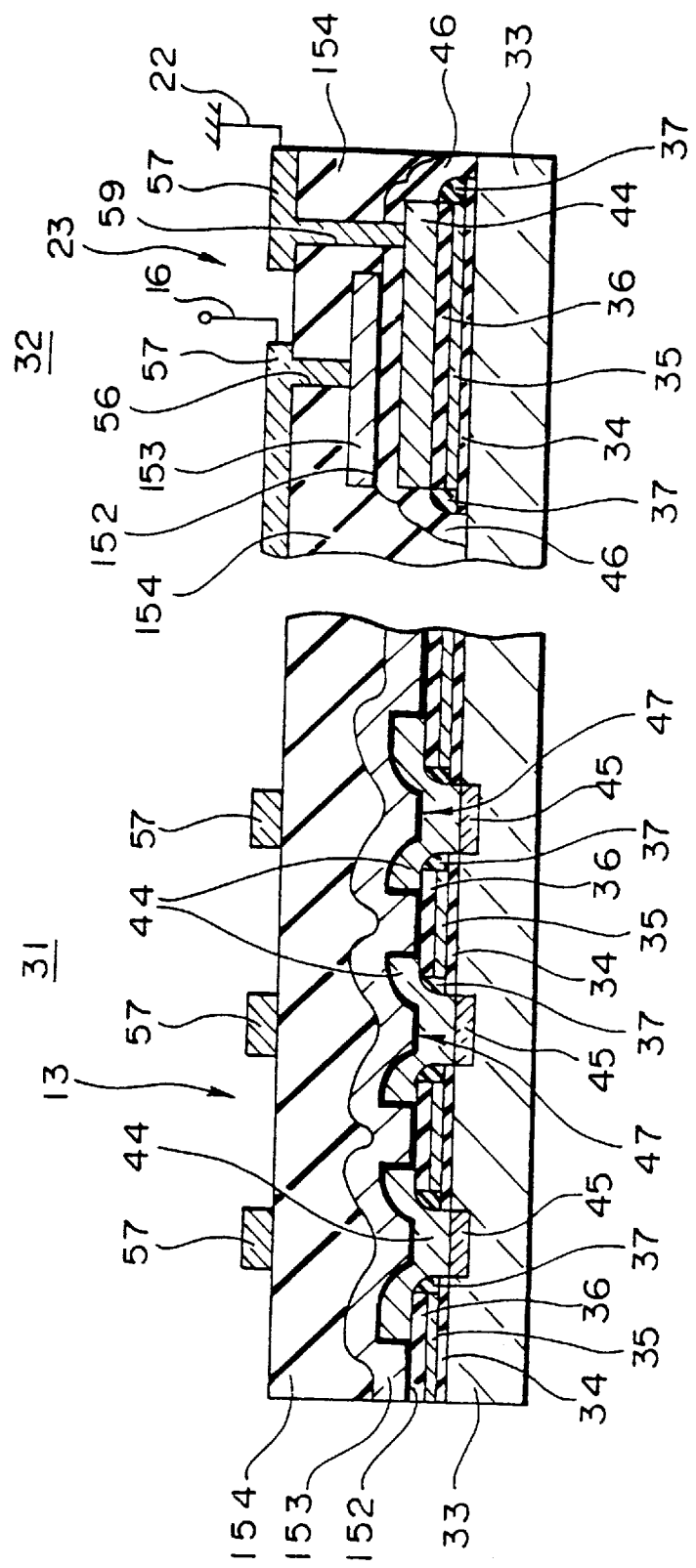
FIG. 6 is a sectional view, similar to FIG. 3, of a DRAM according to another embodiment of the present invention.

Subsequently, as shown in FIG. 6, an interlayer dielectric film (BPSG film) 154 is deposited on the whole surface of the resulting substrate, and the surface of the film 154 is subjected to a flattening step.

By performing the same steps having been described with reference to FIG. 3, the contact windows 55, 56 and 59 are opened, a polysilicon film 57 to fill in those contact windows is formed, the bit lines 15, the external power lines 16 and the grounding lines 22 are formed by patterning of the layer 57. In this manner, a DRAM has been completed.

In this modified embodiment, too, the films 44, 152 and 153 in the filtering capacitor section 32 are made of the same materials as those of the films 44, 152 and 153 in the memory cell array section 31 and are arranged at the same film-formation-step levels of the latter.

In the filtering capacitor of a DRAM obtained by the manufacturing method according to the above-mentioned embodiment, a dielectric layer is formed of silicon oxide films and an ONO film, and therefore the thickness of the dielectric layer calculated in terms of the thickness of the silicon oxide film is about 25 nm. Therefore, even if 5.0 V is applied as the external supply voltage Vccext to the filtering capacitor 23, the field strength at the capacitance insulator film (dielectric layer) is no more than 2 MV/cm.

Figure 16:
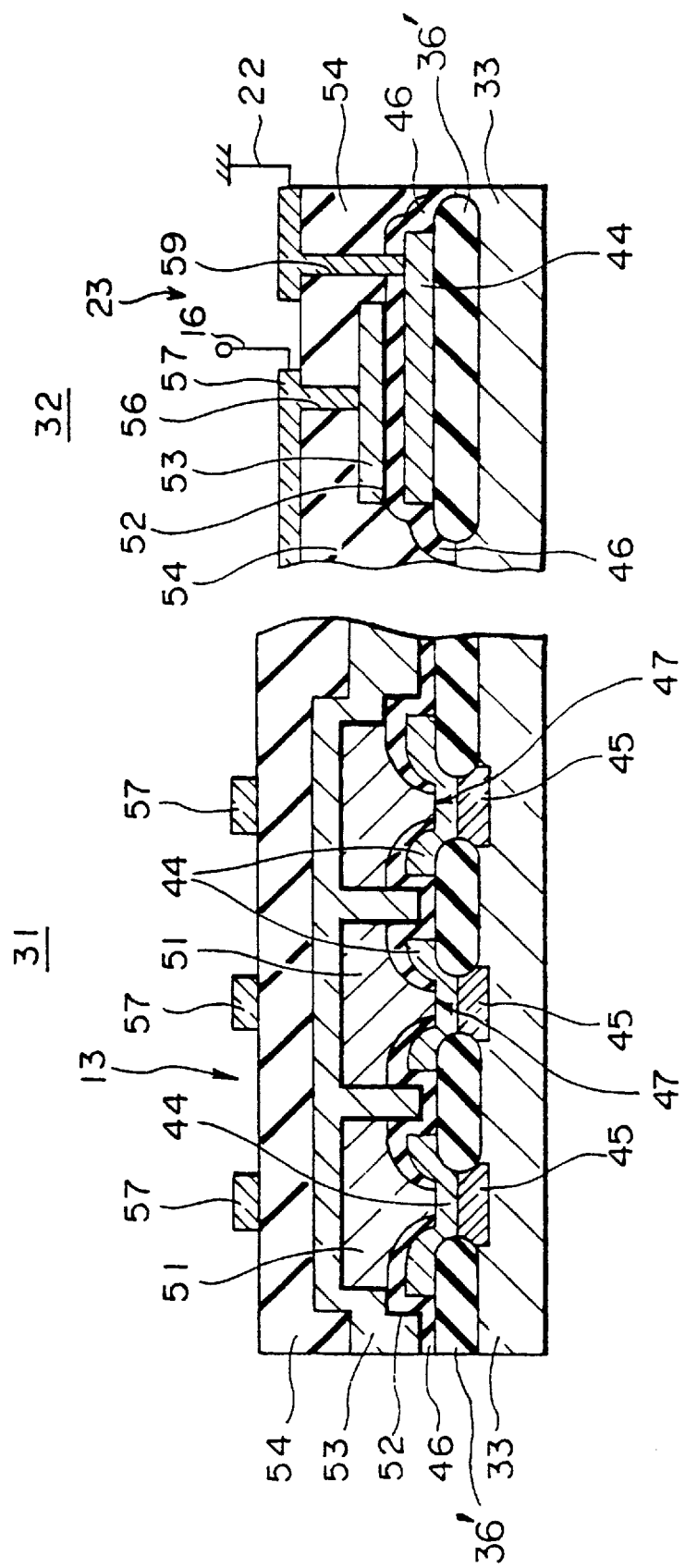
FIG. 16 is a sectional view showing a modification of the embodiment shown in FIG. 3.
Figure 17:
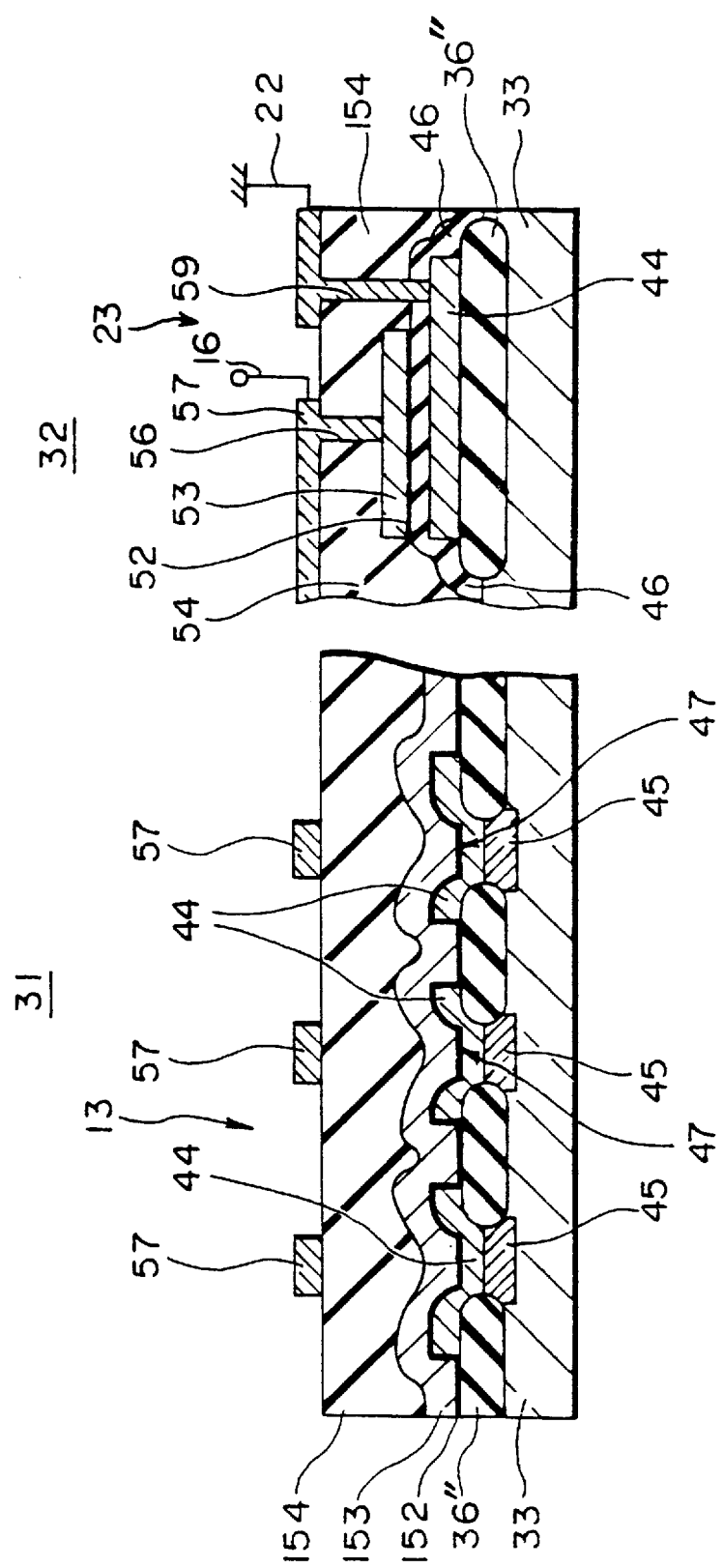
FIG. 17 is a sectional view showing a modification of the embodiment shown in FIG. 6

In the above embodiment, a multi-layer structure of a silicon oxide film and an ONO film is used for the dielectric layer of the filtering capacitor, but only an ONO film may be used. In other words, the thickness of the dielectric layer is adjusted according to whether or not a silicon oxide film is used to form the dielectric layer, by which the field strength of the dielectric layer can be adjusted. Instead of the silicon oxide film, other insulating films such as a silicon nitride film may be used. For isolation of elements, a field oxide film may be used instead of the field-shield structure. FIGS. 16 and 17 show examples of DRAMs in which isolation field oxide films 36', 36" are used. In the drawings, arrangements/structures of members other than those for isolation may be similar to the arrangements/structures shown in FIGS. 3 and 6, respectively.

In the above embodiment, the storage capacitors 13 of the memory cells and the filtering capacitor 23 can be formed simultaneously without increasing the number of steps, so that the devices can be produced with a low production cost.

As has been described, the defect density is low in the dielectric layer of the capacitor responsible for or associated with an external supply voltage to a semiconductor memory device, the field strength in the dielectric layer can be adjusted, and the storage capacitor and the filtering capacitor can be formed at the same time. Consequently, a semiconductor memory device can be obtained, which has a filtering capacitor with high dielectric strength (i.e., a high breakdown voltage) and high reliability, in addition to the memory cell capacitors without increasing the production cost.

Furthermore, when the isolation region is formed by the field-shield structure, since the capacitor responsible for the external power supply is provided on the isolation region, the lower electrode of this capacitor responsible for the external power supply, in particular, is kept at a stable potential, and therefore this capacitor can operate stably.

Figure 7:
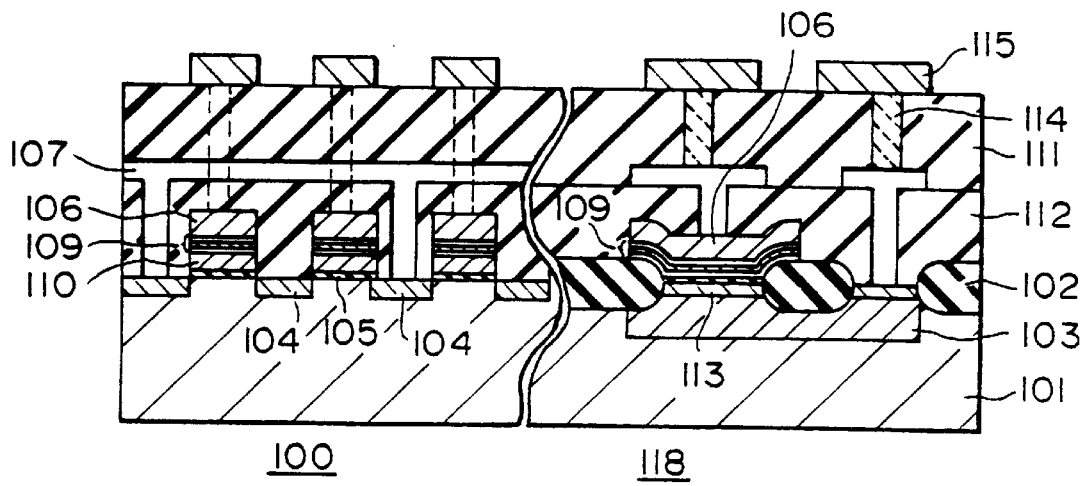
FIG. 7 is a sectional view of a flash EEPROM having a filtering capacitor according to a third embodiment of the present invention.

With reference to FIG. 7 and FIGS. 8a to 8e, a third embodiment of the present invention will be described. FIG. 7 is a sectional view of a flash EEPROM having a filtering capacitor. FIGS. 8a to 8e show a method of manufacturing the flash EEPROM.

In FIG. 7, there are shown for simplicity's sake the memory cell transistor structures 100 (hereafter referred to as memory cells) and a filtering capacitor structure 118 (hereafter referred to as a filtering capacitor). Each memory cell 100 includes doped regions, e.g., source/drain regions of n-type diffusion layers 104 formed in a first part of a main surface of p-type silicon substrate 101 and a multi-layered gate electrode which has a first gate insulating film (a tunnel oxide film) 105 and 10 nm thick, a floating gate electrode (an n-type polysilicon layer about 100–150 nm thick) 110 formed on the first gate insulating film 105 for accumulating charges there, a second gate insulating film 109 formed, for example, by an ONO film (about 20–30 nm thick calculated in terms of the oxide film thickness), and an n-type polysilicon electrode film 106 serving as a word line.

On the other hand, a filtering capacitor 118 includes a capacitor lower electrode of an n-type well 103 formed in a second part of the main surface of the p-silicon substrate 101, an $n^+$-type diffusion layer 113 formed in a portion of the surface of the n-well 103 to minimize a drop of the surface potential at the surface of the substrate, a dielectric layer (about 30–40 nm thick calculated in terms of the oxide film thickness) of a laminate having a film 105 of the same material as the first gate insulating film 105 and a film 109 (about 20–30 nm thick calculated in terms of the oxide film thickness) of the same material as the second gate insulating film 109 and a capacitor upper electrode 106 of n-polysilicon, i.e., of the same material as the word line 106. Thus, the films 105 and 109 and the upper electrode 106 in the filtering capacitor 118 are arranged at the same film-formation-step levels of the films 105 and 109 and the control gate electrode 106 in the memory cell 100. Since it is necessary to keep the n-well 103 as the capacitor lower electrode reverse-biased with respect to the p-silicon substrate 101, a voltage Vccext of 5.0 V is applied to the n-well 103, and a ground potential GND is applied to the n-polysilicon electrode 106 as the capacitor upper electrode. Note that the $n^+$ diffusion layer 113 need not necessarily be provided.

With reference to FIGS. 8a to 8e, a method of manufacturing the semiconductor device shown in FIG. 7 will be described.

Figure 8A:
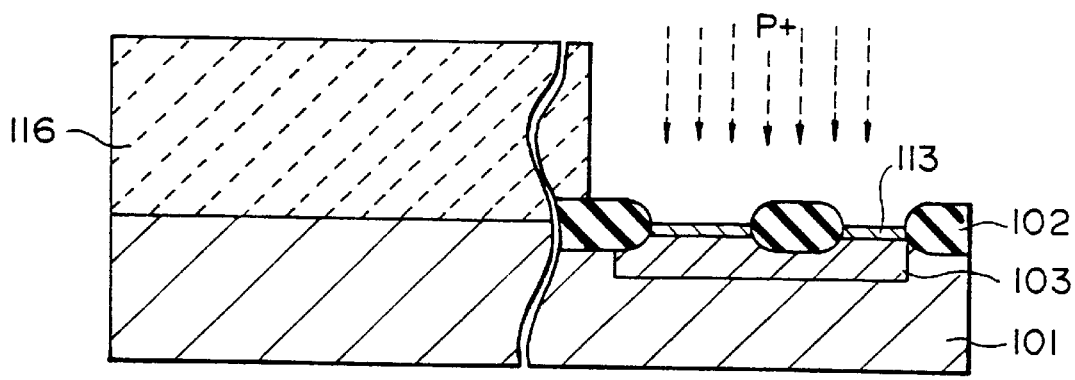
FIGS. 8a to 8e are sectional views showing a manufacturing method of the device shown in FIG. 7.

An n-well 103 is formed in a second part of the main surface of the p-silicon substrate 101. Then, active regions, such as memory cell regions, peripheral circuit regions, and a filtering capacitor region are defined on the main surface of the substrate 101 by the LOCOS process (by an isolation oxide film 102). Here, the first part of the main surface of the substrate 101 includes the memory cell regions and the peripheral circuit regions, and the second part of the substrate 101 includes the filtering capacitor region. After the whole surface is covered with a photoresist 116, by photolithography, leaving only the filtering capacitor region (the second part of the main surface of the substrate 101) exposed, phosphorus ions are implanted only into the active regions of the filtering capacitor region (acceleration energy=150 Kev; dosage=$3 \times 10^{12} cm^{-2}$) to form an $n^+$ diffusion 113. (FIG. 8a)

Figure 8B:
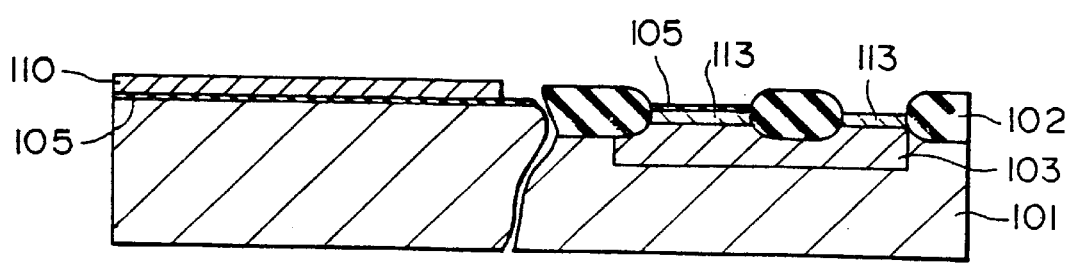

Thereafter, by thermally oxidizing the whole active regions of the semiconductor devices in an oxidizing atmosphere at 800° to 900° C., a first gate insulating film 105 about 10 nm thick is formed. Subsequently, a phosphorus-doped polysilicon layer is deposited (about 150 nm thick; phosphorus density=3 to $5 \times 10^{20} cm^{-3}$) on the first gate insulating film 105 by a low pressure CVD process, and then the phosphorus-doped polysilicon layer is etched away from the regions other than the memory cell regions by photolithography to thereby form a floating gate polysilicon electrode film 110 (FIG. 8b).

Figure 8C:
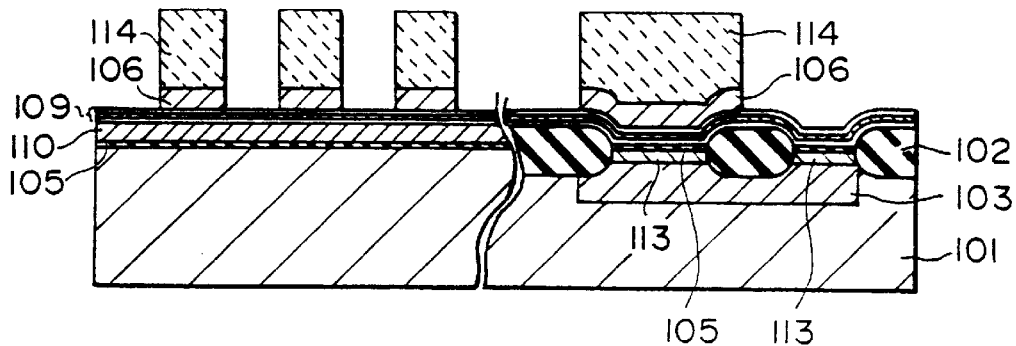

Then, an ONO (oxide-nitride-oxide) film 109 is formed in a manner as described below. A silicon oxide film abut 10 nm thick is formed on the floating gate polysilicon electrode film 110 and the other active regions by thermal oxidation in an oxidizing atmosphere at 800° to 900° C., a silicon nitride film about 20 nm thick is deposited on the silicon oxide film by a low pressure CVD process, and a thermal oxidation film is formed on the silicon nitride film by thermal oxidation in an oxidizing atmosphere at 800° to 900° C. Thus, the second gate insulating film 109, about 20 nm thick calculated in terms of oxide film thickness, is formed. After this, a phosphorus-doped polysilicon film (thickness=about 200 nm; phosphorus density=3 to $5 \times 10^{20} cm^{-3}$) is deposited by a low pressure CVD process. Then the phosphorus-doped polysilicon film is etched away from the regions other than the n-polysilicon films 106 as the word lines (control gate films) in the memory cell regions and the upper electrode film 106 of the filtering capacitor by photolithography (photoresist 114). (FIG. 8c)

The photoresist 114 is then removed, and by using the control gate films 106 and the upper electrode film 106 as a mask, the second gate insulating film 109 and the floating gate polysilicon electrode film 110 are etched away from the unnecessary regions of the films 109 and 110 successively, thus defining floating electrodes 110 in the memory cell regions and a dielectric layer 109 in the filtering capacitor region. Then, by introducing arsenic ions (acceleration energy=75 Kev; dosage=$5 \times 10^{15} cm^{-2}$) into the whole surface of the semiconductor device, n-diffusion layers 104 as the source/drain diffusion layers of the memory cell n-channel transistor structures are formed in the memory cell regions and a capacitor lower electrode diffusion layer 104 is formed in the filtering capacitor region. (FIG. 8d)

Figure 8D:
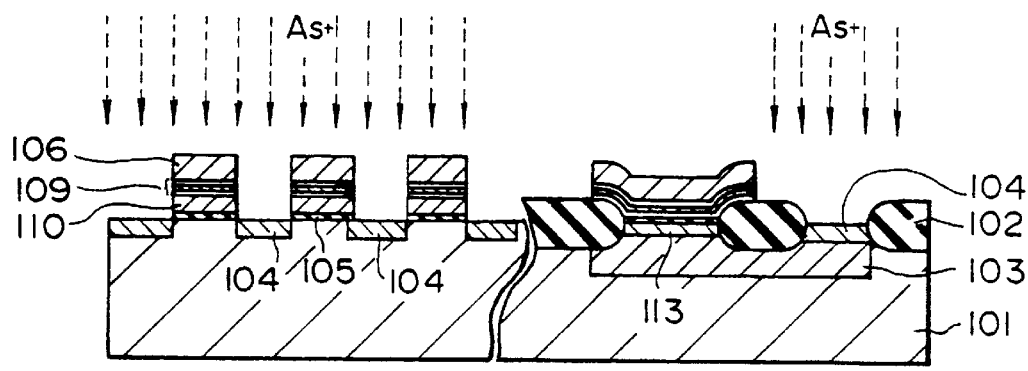
Figure 18:
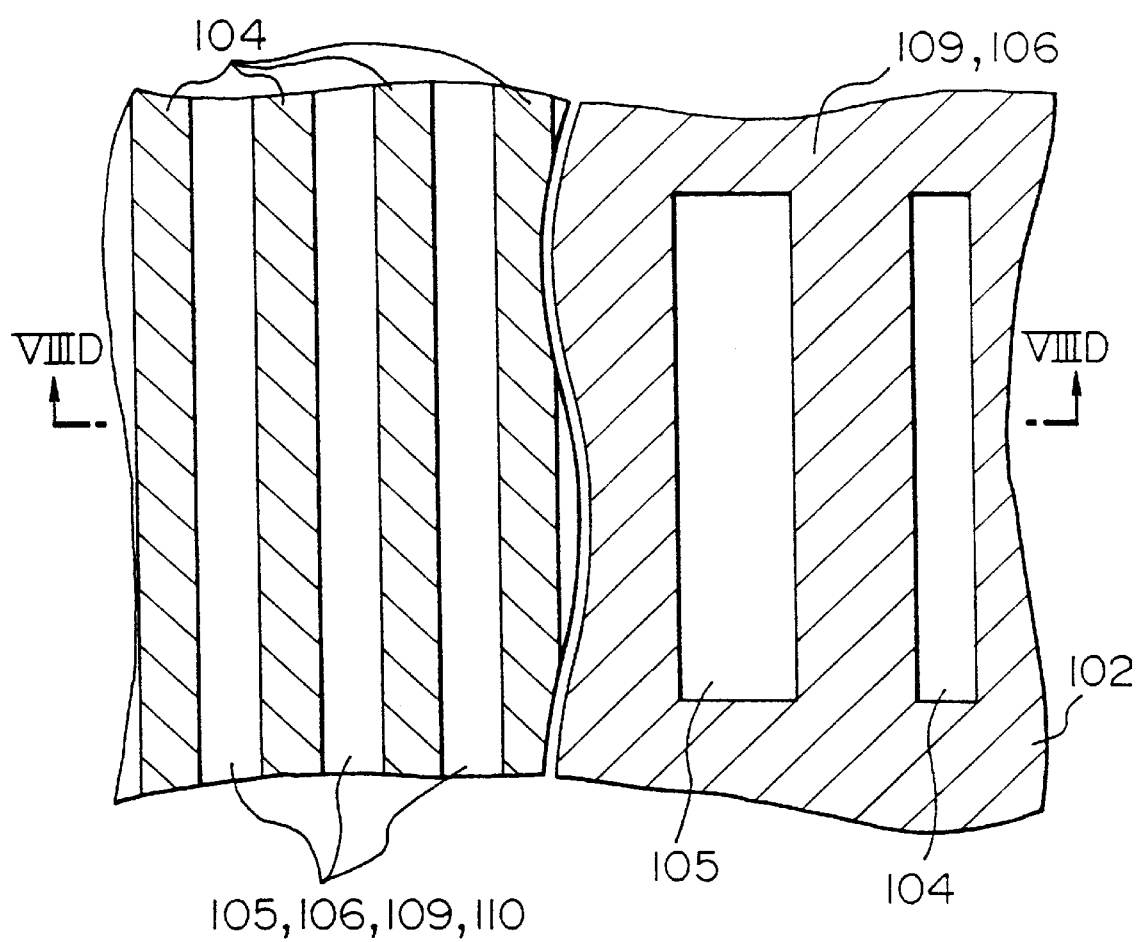
FIG. 18 is a plan view of the substrate in the manufacturing step shown in FIG. 8d.

FIG. 18 is a plan view corresponding to the longitudinal sectional view in FIG. 8d, in other words, FIG. 8d is the longitudinal sectional view taken along the line VIIID—VIIID in FIG. 18.

As shown in FIG. 18, the left-side portion is the region for forming a non-volatile memory cell and the right-side portion is the region for forming a filtering capacitor. The field shield oxide film 102 formed in the filtering capacitor forming region on the right side of FIG. 18 is formed only in the hatched isolation region. The peripheral end portions of the upper electrode 106 and the insulating film 109 of the filtering capacitor are formed to cover the edge of the field oxide film defining the active region. In the patterning step for the floating electrode 110 of the non-volatile memory cell on the left side in FIG. 18, the upper electrode 106 and the insulating film 109 have been patterned over the field oxide film, the surface of the field oxide film 102 serves as an etching stopper. As a result, in the patterning step for the floating gate electrode 110, the semiconductor substrate in the filtering capacitor forming region is prevented from being etched. Note that though the isolation region is formed by the field oxide film 102, an electrode for electrical isolation of the device elements may be used instead.

Figure 8E:
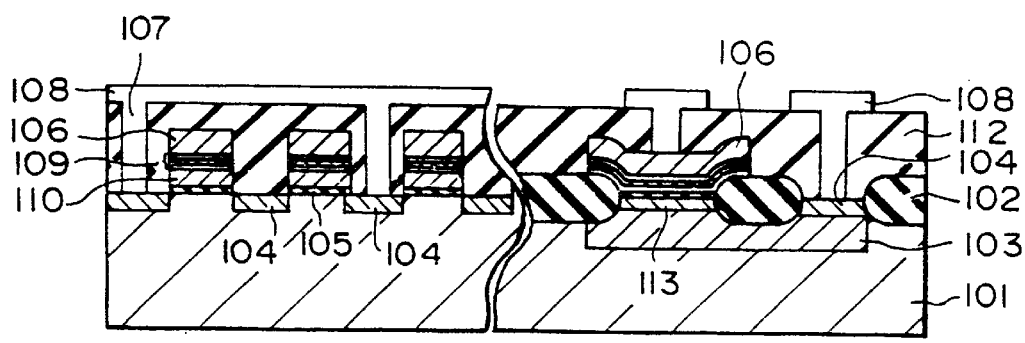

Thereafter, by depositing a BPSG film (500–700 nm thick) by a normal pressure CVD process and making the deposited BPSG film reflow in a steam atmosphere of 850°–900° C., a first interlayer insulating film 112 is formed. Then, by using photolithography, openings are formed in some parts of the first interlayer insulating film, so that the n-diffusion layers 104, the capacitor lower electrode diffusion layer 104, the n-polysilicon electrodes 106 as the word lines (control gate films) in the memory cell regions and the upper electrode film 106 in the filtering capacitor region are partially exposed. Then, first aluminum conductors are formed by sputtering to fill and interconnect the openings. (FIG. 8e)

Thereafter, an oxide film 111 is formed to a thickness of 600 nm on the whole surface of the resulting substrate by a plasma CVD process, and openings are formed only at necessary positions, and then tungsten plugs 114 and second aluminum interconnection conductors 115 are formed successively at the opened contact holes in the ordinary way. A final structure as shown in FIG. 7 is thus obtained.

Figure 9:
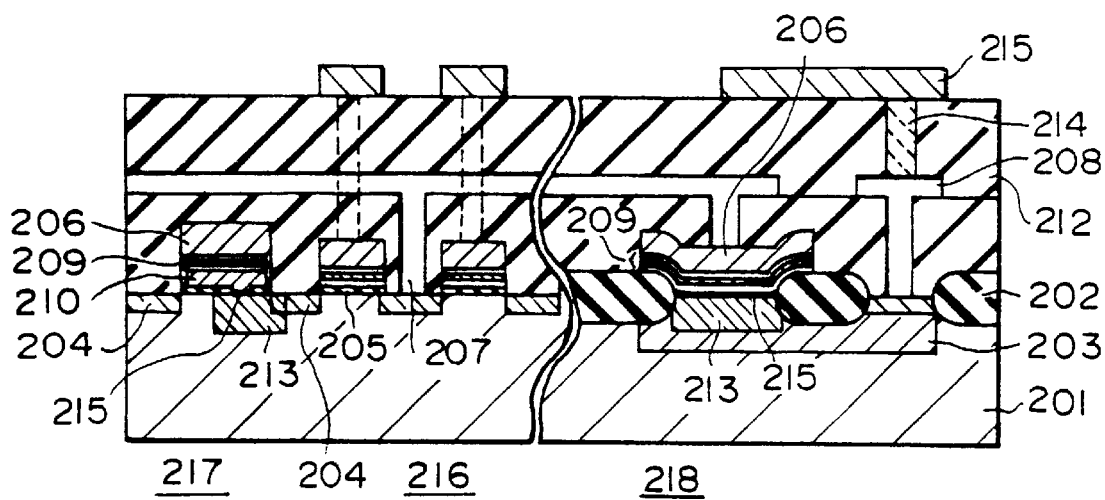
FIG. 9 is a sectional view of a 2-transistor EEPROM having a filtering capacitor according to a fourth embodiment of the present invention.
Figure 10A:
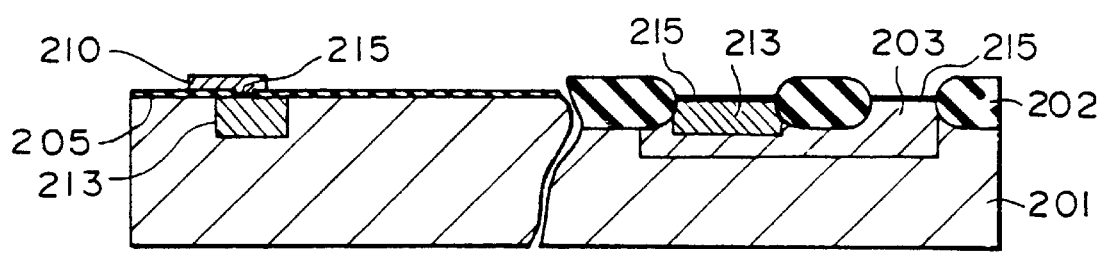
FIGS. 10a to 10d are sectional views showing a manufacturing method of the device shown in FIG. 9.
Figure 10B:
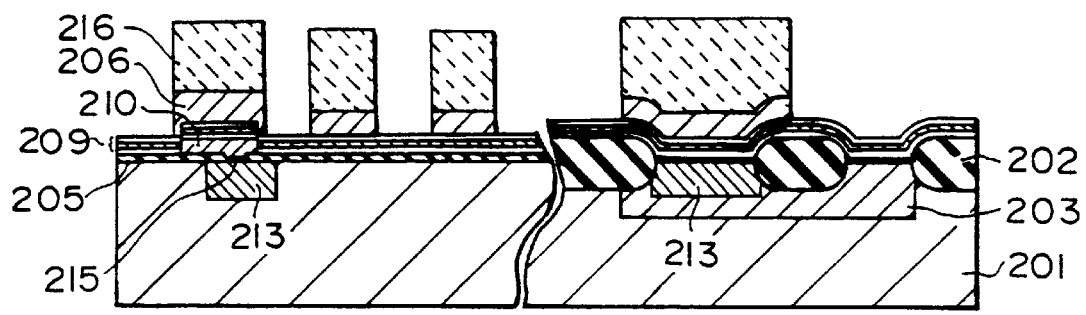
Figure 10C:
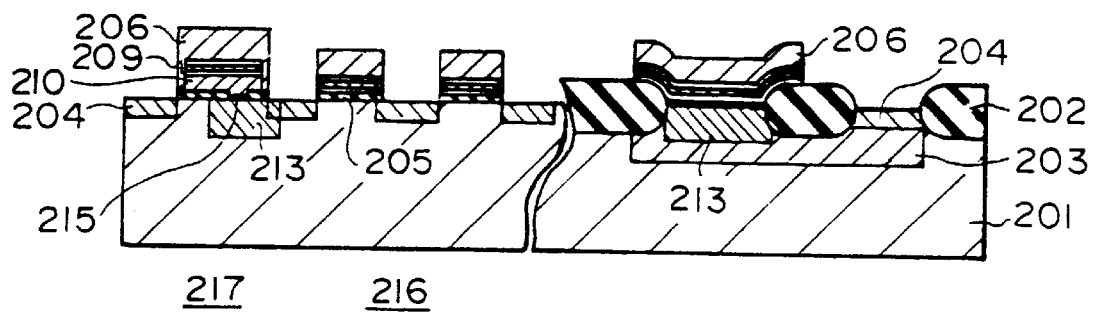
Figure 10D:
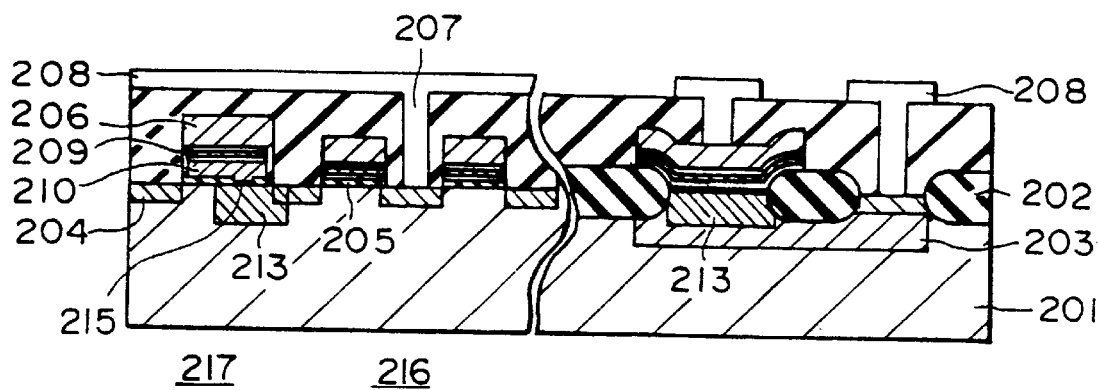
Figure 11:
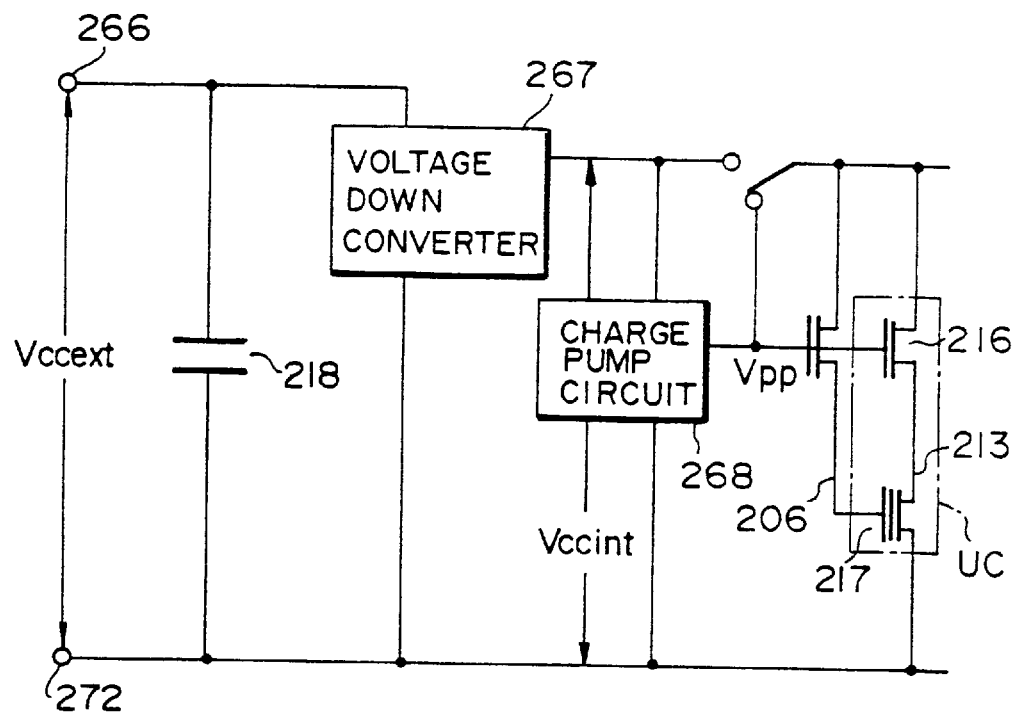
FIG. 11 is an equivalent circuit diagram of a 2-transistor EEPROM having a filtering capacitor.

A fourth embodiment of the present invention will be described with reference to FIGS. 9, 10a to 10d and 11. FIG. 9 is a sectional view of a 2-transistor type EEPROM having a filtering capacitor. FIGS. 10a to 10d show a manufacturing method of this EEPROM. FIG. 11 is an equivalent circuit of the 2-transistor EEPROM having a filtering capacitor.

In FIG. 11, a filtering capacitor 218, connected between an external power supply line 266 and a ground line 272, serves to eliminate noise in the external power supply voltage Vccext so that an output Vccint of a voltage-down converter 267 at the subsequent stage, i.e., the internal power supply voltage, is stabilized. The internal power supply voltage Vccint generated by the internal voltage-down converter 267 is applied to the charge pump circuit 268 to generate a voltage Vpp to be applied to the word line 206 or the drain 213 of the memory cell transistor 217 when data is written or erased. A combination of a selecting transistor 216 and the memory cell transistor 217 forms a unit cell.

Referring now to FIG. 9, in the memory cell transistor structure (hereafter referred to as a memory cell) 217, a first insulating film 205 has a relatively large thickness of about 20 nm, an inner part of which film is made relatively thin, about 10 nm thick, to serve as a tunnel oxide film 215, and through this inner part, electrons are injected/or extracted into and from an $n^+$ diffusion layer (electron injection/extraction region) 213. A gate insulating film 205 of a cell selecting transistor structure 216 is made of the same material as the first gate insulating film 205.

In the third embodiment, an independent process for forming an $n^+$ diffusion layer 213 for the capacitor lower electrode is required, but in this fourth embodiment, since the electron injection/extraction region 213 is an indispensable component of the memory cell transistor structure, this region 213 is formed simultaneously with the n+ diffusion layer 213 on the filter capacitor side, so that the manufacturing of this region 213 does not increase the number of production steps. The wiring arrangement and the bias application method are the same as in the third embodiment, and their descriptions therefore are omitted. Thus, the films 215 and 209 and the upper electrode 206 in the filtering capacitor structure 218 are made of the same materials as those of the films 215 and 209 and the control gate electrode 206 and are arranged at the same film-formation-step levels of the latter.

Referring to FIGS. 10a to 10d, a method of manufacturing the device shown in FIG. 9 will now be described.

Like in the third embodiment, an n-well 203 is formed in the second part of the main surface of the p-silicon substrate 201, and then active regions, such as memory cell regions, peripheral circuit regions and the filtering capacitor region, are defined on the main surface of the substrate 101 by the known LOCOS process (by an isolation oxide film 202). It is assumed that the first and second parts of the main surface of the substrate 201 are the same as were defined in the third embodiment. On all active regions, a first gate insulating film 205 about 20 nm thick is formed by thermal oxidation in an oxidizing atmosphere at 800° to 900° C. The whole surface is covered with a photoresist, not shown, by photolithography, leaving exposed a portion of the n-well 203 in the filtering capacitor region and that portion of the surface of the substrate 201 which is to be covered with a tunnel gate oxide film in the memory cell region, and then arsenic ions are implanted into a portion of the n-well 203 and the surface portion of the substrate 201 (acceleration energy=75 Kev; dosage=$1\times10^{16}$cm$^{-2}$) for their activation. Thus, the electrode contact region 213 of the n+ diffusion layer is formed in the surface of the n-well 203 and the electron injection/extraction region 213 of the n+ diffusion layer is formed in the above-mentioned surface of the substrate 201. A tunnel gate insulating oxide film 215 about 10 nm thick is formed by heat treatment in an oxidizing atmosphere at 700° C. Subsequently, after a phosphorus-doped polysilicon layer (thickness=150 nm, phosphorus density= 3 to $5\times10^{20}$cm$^{-3}$) is deposited on the surface of the substrate by a low pressure CVD process, the deposited phosphorus-doped polysilicon layer in the region other than the memory cell regions is etched away by photolithography to form a floating gate polysilicon electrode film 210. (FIG. 10a)

Thereafter, a second gate insulating film 209 with a thickness of about 20 nm calculated in terms of the oxide film thickness is formed on the whole surface of the substrate by the same method as used in the third embodiment. Subsequently, after a phosphorus-doped polysilicon layer (thickness=about 200 nm; phosphorus ion density=3 to $5\times10^{20}$cm$^{-3}$) is deposited by a low pressure CVD process, the phosphorus-doped polysilicon layer in the region other than the n-polysilicon electrodes 206 as the word line in the memory cell regions (control gate films of the cell transistor structure) and the control electrode films of the cell selecting transistors) and the upper electrode of the filtering capacitor is etched away, using photolithography (photoresist 216). (FIG. 10b)

Thereafter, by using the electrode film 206 and the upper electrode film 206 as a mask, unnecessary parts of the underlying second gate insulating film 209, the first gate insulating film 205 and the tunnel gate oxide film 215 are etched away, and then by using the control gate film 206, the control electrode films 206, and the upper electrode 206 as the mask, arsenic ions are implanted (acceleration energy= 75 Kev; dosage=$5\times10^{15}$ cm$^{-2}$), by which n-diffusion layers 204 as the source/drain diffusion layers of the memory cell n-channel transistor structure 217 and the cell selecting n-channel transistor structure 216 are formed in the memory cell region and a capacitor lower electrode diffusion layer 204 is formed in the filtering capacitor region. (FIG. 10c) Note that one of the source/drain diffusion layers 204 overlaps the electron injection/extraction region 213 and has a impurity concentration lower than the region 213.

Thereafter, a first interlayer insulating film 212 is formed, and first aluminum wiring conductors 208, bit contacts 207 to the source/drain diffusion layers 204 of the cell selecting transistor structure, contacts to the upper electrode 206 and the lower electrode diffusion layer 204 are provided for electrical interconnection in the same manner as in the third embodiment. (FIG. 10d)

Furthermore, an oxide film 600 nm thick is deposited by a plasma CVD process, openings are formed at specified positions, and tungsten plugs 214 and second aluminum interconnection conductors 215 are sequentially formed at the openings of the contact holes, by which the construction shown in FIG. 9 is eventually obtained.

As has been described, a filtering capacitor subjected to an effectively low electric field intensity and having high reliability can be provided without increasing the number of process steps. Moreover, since a so-called ONO film made up of an oxide film, a silicon nitride film and an oxide film is used for the second gate insulating film 209, a good quality capacity insulator film with a far lower defect density than the thermal oxide film can be formed. In this embodiment, description has been made of the filtering capacitor, but this invention can be applied to a capacitive component, such as an internal charge pump circuit or the like to which a high voltage is applied.

Figure 15:
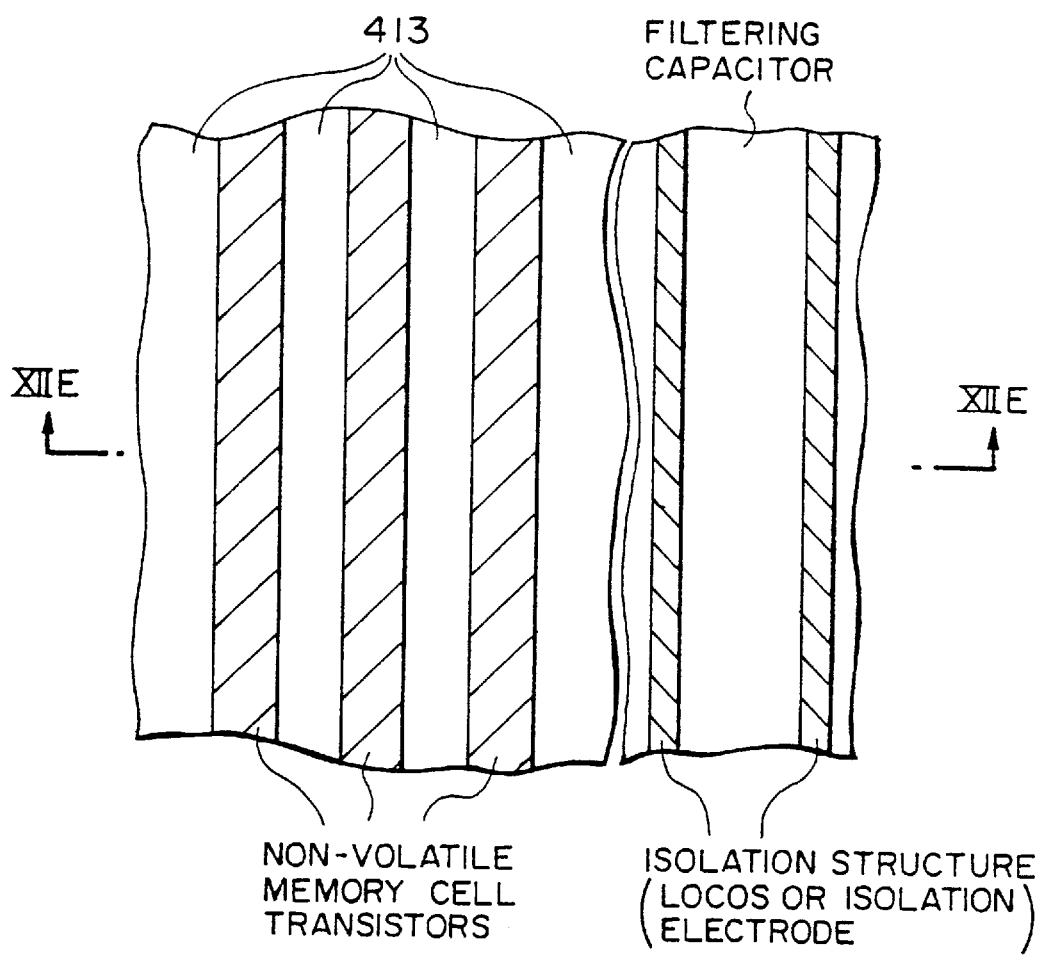
FIG. 15 is a plan view of the substrate in the manufacturing step shown in FIG. 12e.

Reference will next be made to FIGS. 12a to 12f and 13 to describe a fifth embodiment. FIGS. 12a to 12f and 13 show process steps in the fabrication of a non-volatile semiconductor memory device with a filtering capacitor. FIG. 15 is a plan view corresponding to the longitudinal sectional view in FIG. 12e.

Figure 12A:
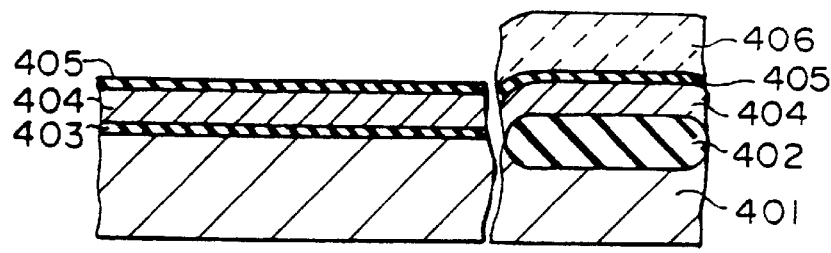
FIGS. 12a to 12f and FIG. 13 are sectional views showing a manufacturing method of a flash EEPROM having a filtering capacitor according to a fifth embodiment of the present invention.

An isolation region 402 made of a thermal oxidation film is formed by a well-known LOCOS process on the region of a p-silicon substrate 401 where a filtering capacitor structure (hereafter, also referred to as a filtering capacitor) (namely, in a second part of the main surface of the substrate 401). Subsequent to this, a gate insulating film 403, which is a thermal oxidation film about 10 to 15 nm thick is formed on the whole surface of the p-substrate 401, then an n-type impurity-containing first polysilicon film 404 is deposited on the gate insulating film 403 by a CVD process. Then, a silicon oxide film 405 with a thickness of about 200 Å is deposited on the first polysilicon film 404 by a CVD process. The resulting substrate is covered on its whole surface with a resist film 406, and then the resist film 406 on the regions, in which non-volatile memory cells are to be formed, is removed by a ptotolithographic technique, thus leaving the resist film 406 intact only on the isolation region 402. (FIG. 12a)

Figure 12B:
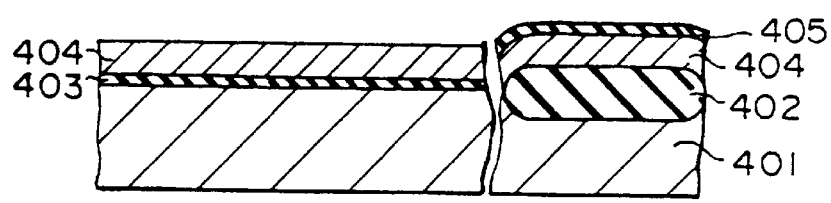

Using the resist film 406 as a mask, the silicon oxide film 405 on the regions for forming the non-volatile memory cells is removed by anisotropic etching, with a result that the surface of the first polysilicon film 404 is exposed. After the above-mentioned silicon oxide film 405 has been removed, the resist film 406 on the filtering capacitor side is removed. (FIG. 12b)

Figure 12C:
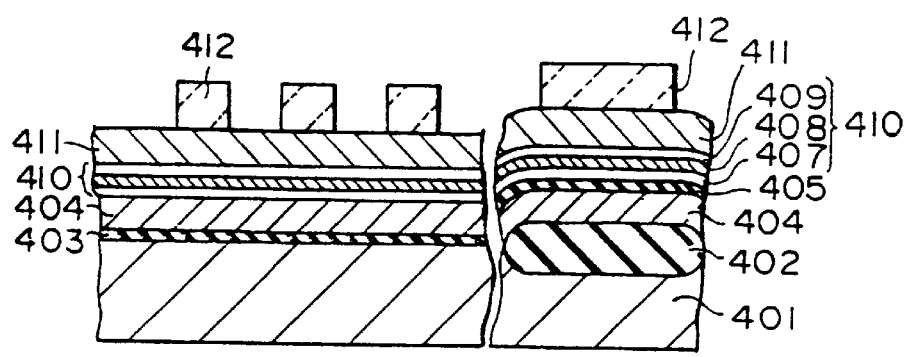

Then, a thermal oxidation film 407 with a thickness of 10 nm is formed on the surface of the first polysilicon film 404 in the region for forming non-volatile memory cells and on the surface of the silicon oxide film 405 and, subsequently, a silicon nitride film 408 with a thickness of about 20 nm is deposited by a CVD process. The resulting substrate is subjected to thermal oxidation in a steam oxidizing atmosphere at 800° to 900° C., so that a thermal oxidation film 409 is deposited to a thickness of about 10 nm on the silicon nitride film 408. The multilayered dielectric film composed of the thermal oxide film 407, the silicon nitride film 408, and the thermal oxide film 409 is called an ONO film 410. On the whole surface of the ONO film, an n-impurity containing second polysilicon film 411 is deposited. After covering the second polysilicon film 411 with a resist film 412, the resist film 412 is patterned by a photolithographic technique. As a result, a resist pattern is formed to form non-volatile memory cell transistor structures (hereafter simply referred to as non-volatile memory cell transistors) 400 in the regions for forming non-volatile memory cells, that is, in the first part of the main surface of the substrate 401. On the other hand, a resist pattern is formed to form a filtering capacitor structure (hereafter simply referred to as a filtering capacitor) 418 in the isolation region 402. (FIG. 12c)

Figure 12D:
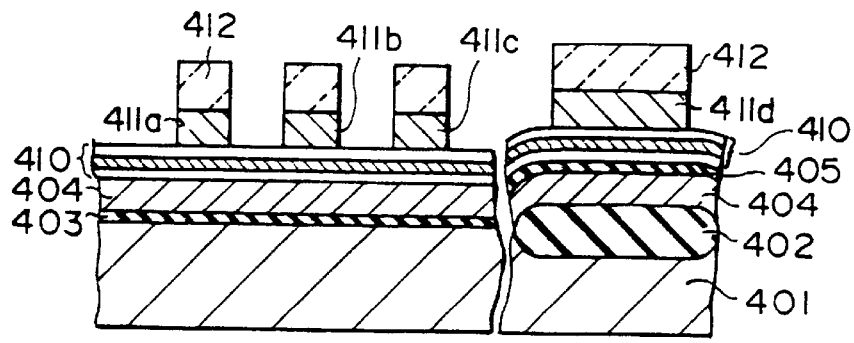

After that, by anisotropic etching of the second polysilicon film 411 by using the patterned resist film 412 as the mask, control gate electrode films 411a, 411b and 411c each made of the second polysilicon film 411 are formed in the non-volatile memory cell forming region and an upper electrode film 411d of the filtering capacitor made of the second polysilicon film 411 is formed on the isolation region 402. (FIG. 12d)

Thereafter, the resist film 412 is removed, and by using the patterned second polysilicon films 411a, 411b, 411c and 411d as a mask, the ONO film 410, the silicon oxide film 405, the first polysilicon film 404, and the gate oxide film 403 are etched sequentially. As a result, floating gate electrode films 404a, 404b and 404c each made of the first polysilicon film 404 are formed on the non-volatile memory cell forming region of the p-silicon substrate 401, and control gates 411a, 411b and 411c are formed on the floating gate electrode films 404a, 404b and 404c with interposition of the ONO film 410.

On the other hand, on the isolation region 402, a lower electrode 404d made of the first polysilicon film 404 is formed on the isolation region 402, and a filtering capacitor upper electrode 411d made of the second polysilicon film 411 is formed with interposition of the silicon oxide film 405 and the ONO film 410. Since the dielectric layer of the filtering capacitor includes the silicon oxide film 405 in addition to the ONO film 410, the current leakage of the filtering capacitor is suppressed, so that the filtering capacitor has an improved dielectric strength. At the next step, by ion implantation by using the control electrodes 411a, 411b and 411c as a mask, arsenic ions are implanted into the p-silicon substrate 401 of the non-volatile memory cell forming region (acceleration energy=75 Kev; dosage=5× $10^{15} cm^{-2}$). The resulting substrate is subjected to a heat treatment by which n-type impurity diffused layers (doped regions) 413 as the source/drain regions of the non-volatile memory cell transistors are formed in the surface layer of the p-silicon substrate 401. (FIG. 12e)

Figure 12E:
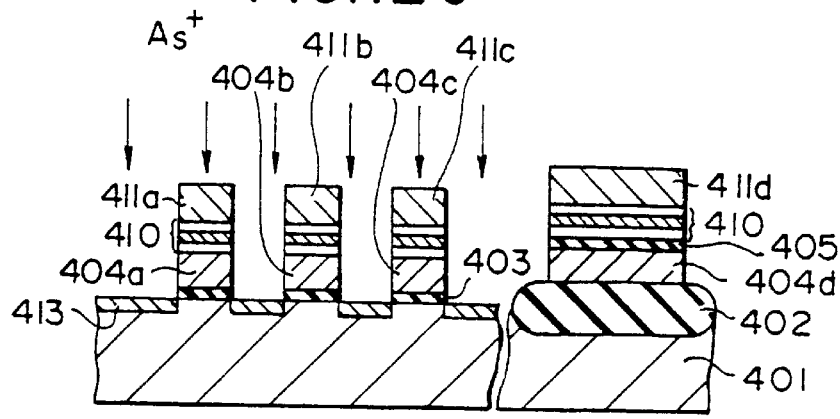

FIG. 15 is a plan view corresponding to the longitudinal sectional view in FIG. 12e. In other words, FIG. 12e is a longitudinal sectional view taken along line 12E—12E in FIG. 15.

As FIG. 15 shows, the region for the non-volatile memory cells is on the left side and the region for the filtering capacitor is on the right side. In FIG. 15, the filtering capacitor is formed only on the isolation region 402. Note that the isolation region 402 is formed by a LOCOS oxide film, but may be formed by an isolation electrode to electrically isolate the device elements from each other and the filtering capacitor may be formed on such isolation electrode. The manufacturing process of this multilayered structure will be shown in FIG. 14.

Figure 12F:
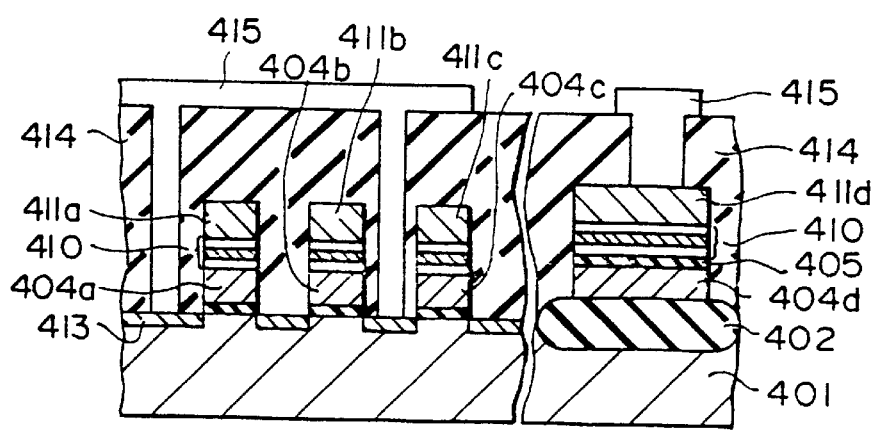

Turning now to FIG. 12f, after a first interlayer insulating film 414 is formed on the whole surface of the resulting substrate, a plurality of first contact holes passing through the first interlayer insulating film 414 are formed. The plurality of the first contact holes include contact holes reaching at least either one of the source and the drain of each non-volatile memory cell transistor and a contact hole reaching the surface of the upper electrode 411d of a filtering capacitor. Afterwards, an aluminum interconnection layer 415 is formed by sputtering.

Figure 13:
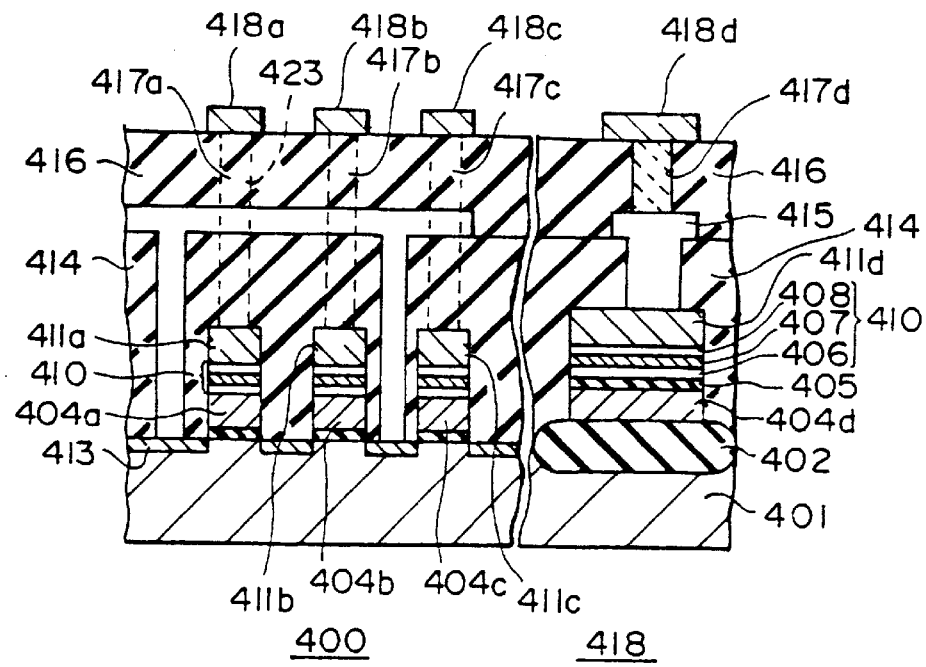

Subsequently, a second insulating film 416 is deposited on the whole surface of the resulting substrate including the patterned aluminum interconnection layer 415. Second contact holes reaching the surface of the aluminum interconnection layer 415 connected to the upper electrode 411d of the filtering capacitor are formed. Furthermore, third contact holes 423 reaching the surface of the control gate electrodes 411a, 411b and 411c of the non-volatile memory cell transistors are formed in the second interlayer insulating film 416 and the first interlayer insulating film 414. Then, tungsten plugs 417a, 417b, 417c and 417d filling the second and third contact holes are formed. Then, aluminum interconnection layer 418 is formed on the whole surface of the multilayered substrate by sputtering. The aluminum interconnection layer 418 is patterned to form aluminum interconnection layers 418a, 418b, 418c and 418d being connected to the tungsten plugs 417a, 417b, 417c and 417d. (FIG. 13)

By the foregoing production procedure, the non-volatile memory cell transistor structures and the filtering capacitor structure can be formed simultaneously, so that this invention makes it possible to simplify the production process of semiconductor devices. In addition, since the filtering capacitor structure can be formed on the isolation region 402, the chip area can be decreased. Furthermore, since the dielectric layer of the filtering capacitor structure includes the ONO film 410 and the silicon oxide film 405, the current leakage of the filtering capacitor is suppressed, so that the dielectric strength is improved. Thus, the lower electrode 404d, the film 410 and the upper electrode 411d in the filtering capacitor are made of the same materials as those of the floating gate electrode 404a, the film 410 and the control gate 411a in the non-volatile memory cell transistor and are arranged at the same film-formation-step levels as the latter.

In place of the LOCOS oxide film 402 in the above embodiment described above, an isolation electrode 419 of the field shield structure may be used, as mentioned above. This isolation electrode 419 is intended to electrically isolate the device forming regions located across the isolation region, and performs the same role as the LOCOS oxide film 402. As for a specific isolation method of the isolation electrode 419, by fixing the electrode 419 at a constant potential (the ground or ½ Vcc, for example), the two device forming regions located on both sides of the isolation electrode 419 can be isolated from each other.

The method of forming the above-mentioned isolation electrode 419 may be as follows. First, a gate insulating film 420, an n-type impurity-containing polysilicon film 419 as the isolation electrode and an oxide film 421 by a CVD process are deposited sequentially in the p-silicon substrate region for forming the isolation region, and then by patterning the oxide film 421, the polysilicon film 419 and the gate insulating film 420 in that order in the whole of the isolation region, the isolation electrode 419 made of the polysilicon film 419 is formed. Thereafter, an oxide film 422 by a CVD process is deposited on the whole surface of the oxide film 422, and by anisotropic etching of the oxide film 422, the side-wall oxide film 422 is formed consisting only of those portions of the oxide film 422 which remain at the side walls of the isolation electrode 419, by which step, the field shield structure is completed. The isolation electrode is finished by the subsequent process to provide electrical connection for external control.

Figure 14:
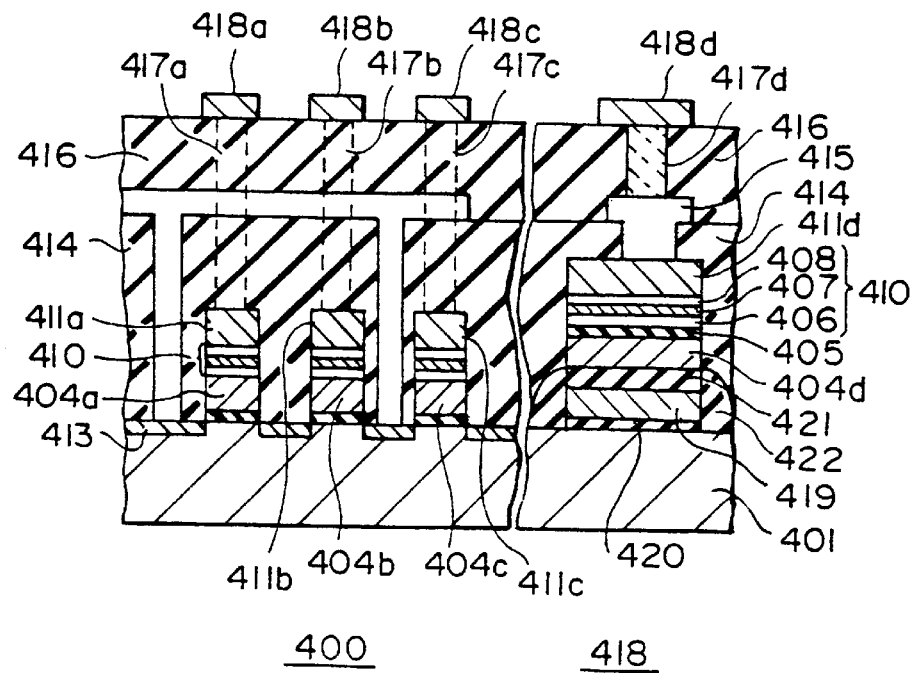
FIG. 14 is a sectional view showing a modification of the fifth embodiment of the present invention.

As shown in FIG. 14, since the filtering capacitor is formed on the isolation electrode 419 fixed at a certain potential, the filtering capacitor itself, formed on the isolation electrode 419, is placed at a stable potential and, therefore, the filtering function of the filtering capacitor is improved.

I claim:

1. A semiconductor device comprising:
    element forming regions in which to form semiconductor elements at a semiconductor substrate;
    a patterned isolation region for defining said element forming regions at said semiconductor substrate;
    a field shield isolation structure formed in said isolation region for electrically isolating said semiconductor elements formed in said element forming region from one another; and
    a filtering capacitor, formed on a part of said isolation structure, for removing noise in a power supply line for the semiconductor device, said filtering capacitor including a lower electrode formed on said field shield isolation structure, an upper electrode, and a dielectric layer formed between said lower electrode and upper electrode and having at least an oxide film and a nitride film, one of said upper and lower electrodes being formed on said dielectric layer for connection with said power supply line.

2. A semiconductor device according to claim 1, wherein said dielectric layer has at least an ONO (oxide-nitride-oxide) film.

3. A semiconductor device according to claim 1, wherein said dielectric layer includes an oxide film and an ONO film formed on said oxide film.

4. A semiconductor device according to claim 1, where first electrically conducting films, a dielectric layer, a second electrically conducting film are formed in said element forming regions, said first conducting films being at a same film-formation-step level as and being separate from said lower electrode of said filtering capacitor, said dielectric layer being formed on said first conducting films and including an oxide film and a nitride film, and said second conducting film being arranged at a same film-formation-step level as and being separated from said upper electrode of said filtering capacitor.

5. A semiconductor device according to claim 4, wherein each of said first conducting films serves as a lower electrode of an information storage capacitor and said second conducting film services as an upper electrode of said information storage capacitor, the lower electrode of said information storage capacitor and the upper electrode of said storage capacitor are arranged opposite to each other across said dielectric layer, said filtering capacitor having a breakdown voltage higher than that of said information storage capacitor.

6. A semiconductor device according to claim 5, wherein said dielectric layer is an ONO film.

7. A semiconductor device according to claim 5, wherein transfer gate transistors are formed in said element forming regions, the lower electrode of each of said information storage capacitors is electrically connected to one of a pair of source/drain regions of said transfer gate transistor.

8. A semiconductor device according to claim 5, wherein the dielectric layer of said filter capacitor has a thickness larger than that of said information storage capacitor.

9. A semiconductor according to claim 8, wherein the dielectric layer of said filter capacitor includes an ONO film and an oxide film formed thereon, and the dielectric layer of said information storage capacitor includes an ONO film.

10. A semiconductor device according to claim 4, wherein each of said first conducting films serves as a floating gate of a non-volatile memory cell transistor, said second conducting film is patterned to provide a control gate of said non-volatile memory cell transistor, and said floating gate and said control gate are arranged opposite to each other across said dielectric layer.

11. A semiconductor device according to claim 10, wherein said dielectric layer is an ONO film.

12. A semiconductor device according to claim 4, wherein said dielectric layer is an ONO film.

13. A semiconductor device according to claim 4, wherein the lower electrode of said filter capacitor and said first conducting films include the same material, the upper electrode of said filtering capacitor and said second conducting film include the same material, and said dielectric layer of said filtering capacitor and said dielectric layer of said storage capacitor include the same material.

14. A semiconductor device according to claim 4, wherein each of said first conducting films serves as a first lower electrode of an information storage capacitor, a second lower electrode is formed on each of said first lower electrodes to cooperate therewith, said second conducting film serves as an upper electrode of said information storage capacitor, and said second lower electrode and said upper electrode of said information storage capacitor are arranged opposite to each other across said dielectric layer.

15. A semiconductor device according to claim 14, wherein the dielectric layer of said filter capacitor has a thickness larger than that of said information storage capacitor.

16. A semiconductor according to claim 15, wherein the dielectric layer of said filter capacitor includes an ONO film and an oxide film formed thereon, and the dielectric layer of said information storage capacitor includes an ONO film.

17. A semiconductor device according to claim 14, wherein an insulating film is formed between said first lower electrode and said second lower electrode of said information storage capacitor, and said first lower electrode and said second lower electrode are connected through a contact hole formed in said insulating film.

18. A semiconductor device according to claim 17, wherein said insulating film is an oxide film.

19. A semiconductor device according to claim 1, wherein:
    first electrically conducting films, a dielectric layer and a second electrically conducting film are formed in said element forming regions, each of said first conducting films being arranged at the same film-formation-step level as and being separated from said lower electrode of said filtering capacitor, said dielectric layer including said oxide film and a nitride film formed on said first conducting film, said second conducting film being arranged at the same film-formation-step level as and being separated from the upper electrode of said filtering capacitor;

each of said first conducting films serves as a first lower electrode of an information storage capacitor and a second lower electrode is formed on said each first lower electrode so that said first and second lower electrodes cooperate to serve as a lower electrode of said information storage capacitor while said second conducting film serves as an upper electrode and the upper electrode of said storage capacitor being arranged opposite to each other across the dielectric layer;

an oxide film is provided on the lower electrode of said filtering capacitor, said dielectric layer is formed on said oxide film, and the upper electrode of said filtering capacitor is formed on the dielectric layer of said filtering capacitor; and an oxide film made of the same material as said oxide film of said filtering capacitor is arranged at the same film-formation-step level as said oxide film of said filtering capacitor and is located between said first lower electrode and said second lower electrode of said information storage capacitor, and said first and second lower electrodes are connected through a contact hole formed in said oxide film for said information storage capacitor.

20. A semiconductor device according to claim 1, wherein first electrically conducting films, a dielectric layer, a second electrically conducting film are formed in said element forming regions, said first conducting films being made of the same material as that of and being separated from said lower electrode of said filtering capacitor, said dielectric layer being formed on said first conducting films and including an oxide film and a nitride film, and said second conducting film being made of the same material as that of and being separated from said upper electrode of said filtering capacitor.

21. A semiconductor device according to claim 20, wherein each of said first conducting films serves as a lower electrode of an information storage capacitor and said second conducting film serves as an upper electrode of said information storage capacitor, the lower electrode of said information storage capacitor and the upper electrode of said storage capacitor are arranged opposite to each other across said dielectric layer, said filtering capacitor having a breakdown voltage higher than that of said information storage capacitor.

22. A semiconductor device according to claim 21, wherein said dielectric layer is an ONO film.

23. A semiconductor device according to claim 21, wherein transfer gate transistors are formed in said element forming regions, the lower electrode of each of said information storage capacitors is electrically connected to one of a pair of source/drain regions of said transfer gate transistor.

24. A semiconductor device according to claim 21, wherein the dielectric layer of said filter capacitor has a thickness larger than that of said information storage capacitor.

25. A semiconductor according to claim 24, wherein the dielectric layer of said filter capacitor includes an ONO film and an oxide film formed thereon, and the dielectric layer of said information storage capacitor includes an ONO film.

26. A semiconductor device according to claim 20, wherein each of said first conducting films serves as a floating gate of a non-volatile memory cell transistor, said second conducting film is patterned to provide a control gate of said non-volatile memory cell transistor, and said floating gate and said control gate are arranged opposite to each other across said dielectric layer.

27. A semiconductor device according to claim 26, wherein said dielectric layer is an ONO film.

28. A semiconductor device according to claim 20, wherein said dielectric layer is an ONO film.

29. A semiconductor device according to claim 20, wherein the lower electrode of said filter capacitor and said first conducting films include the same material, the upper electrode of said filtering capacitor and said second conducting film include the same material, and said dielectric layer of said filtering capacitor and said dielectric layer of said storage capacitor include the same material.

30. A semiconductor device according to claim 20, wherein each of said first conducting films serves as a first lower electrode of an information storage capacitor, a second lower electrode is formed on each of said first lower electrodes to cooperate therewith, said second conducting film serves as an upper electrode of said information storage capacitor, and said second lower electrode and said upper electrode of said information storage capacitor are arranged opposite to each other across said dielectric layer.

31. A semiconductor device according to claim 30, wherein an insulating film is formed between said first lower electrode and said second lower electrode of said information storage capacitor, and said first lower electrode and said second lower electrode are connected through a contact hole formed in said insulating film.

32. A semiconductor device according to claim 30, wherein an insulating film is formed between said first lower electrode and said second lower electrode of said information storage capacitor, and said first lower electrode and said second lower electrode are connected through a contact hole formed in said insulating film.

33. A semiconductor device according to claim 32, wherein said insulating film is an oxide film.

34. A semiconductor device according to claim 30, wherein the dielectric layer of said filter capacitor has a thickness larger than that of said information storage capacitor.

35. A semiconductor according to claim 34, wherein the dielectric layer of said filter capacitor includes an ONO film and an oxide film formed thereon, and the dielectric layer of said information storage capacitor includes an ONO film.

36. A semiconductor device comprising:
    element forming regions in which to form semiconductor elements at a semiconductor substrate;
    a patterned isolation region for defining said element forming regions at said semiconductor substrate;
    an insulating material formed in said isolation region for electrically isolating said semiconductor elements formed in said element forming region from one another; and
    a filtering capacitor, formed on a part of said insulating material, for removing noise in a power supply line for the semiconductor device, said filtering capacitor including a lower electrode formed on said insulating material, an upper electrode, and a dielectric layer formed between said lower electrode and upper electrode and having at least an oxide film and a nitride film, one of said upper and lower electrodes being formed on said dielectric layer for connection with said power supply line.

37. A semiconductor device according to claim 36, wherein said dielectric layer has at least an ONO (oxide-nitride-oxide) film.

38. A semiconductor device according to claim 36, wherein said dielectric layer includes an oxide film and an ONO film formed on said oxide film.

39. A semiconductor device according to claim 36, wherein first electrically conducting films, a dielectric layer, a second electrically conducting film are formed in said element forming regions, said first conducting films being at a same film-formation-step level as and being separated from said lower electrode of said filtering capacitor, said dielectric layer being formed on said first conducting films and including an oxide film and a nitride film, and said second conducting film being arranged at a same film-formation-step level as and being separated from said upper electrode of said filtering capacitor.

40. A semiconductor device according to claim 39, wherein each of said first conducting films serves as a lower electrode of an information storage capacitor and said second conducting film serves as an upper electrode of said information storage capacitor, the lower electrode of said storage capacitor and the upper electrode of said information storage capacitor are arranged opposite to each other across said dielectric layer, said filtering capacitor having a breakdown voltage higher than that of said information storage capacitor.

41. A semiconductor device according to claim 40, wherein said dielectric layer is an ONO film.

42. A semiconductor device according to claim 40, wherein transfer gate transistors are formed in said element forming regions, the lower electrode of each of said information storage capacitors is electrically connected to one of a pair of source/drain regions of said transfer gate transistor.

43. A semiconductor device according to claim 40, wherein the dielectric layer of said filter capacitor has a thickness larger than that of said information storage capacitor.

44. A semiconductor according to claim 43, wherein the dielectric layer of said filter capacitor includes an ONO film and an oxide film formed thereon, and the dielectric layer of said information storage capacitor includes an ONO film.

45. A semiconductor device according to claim 39, wherein each of said first conducting films serves as a floating gate of a non-volatile memory cell transistor, said second conducting film is patterned to provide a control gate of said non-volatile memory cell transistor, and said floating gate and said control gate are arranged opposite to each other across said dielectric layer.

46. A semiconductor device according to claim 45, wherein said dielectric layer is an ONO film.

47. A semiconductor device according to claim 39, wherein said dielectric layer is a ONO film.

48. A semiconductor device according to claim 39, wherein the lower electrode of said filter capacitor and said first conducting films include the same material, the upper electrode of said filtering capacitor and said second conducting film include the same material, and said dielectric layer of said filtering capacitor and said dielectric layer of said storage capacitor include the same material.

49. A semiconductor device according to claim 39, wherein each of said first conducting films serves as a first lower electrode of an information storage capacitor, a second lower electrode is formed on each of said first lower electrodes to cooperate therewith, said second conducting film serves as an upper electrode of said information storage capacitor, and said second lower electrode and said upper electrode of said information storage capacitor are arranged opposite to each other across said dielectric layer.

50. A semiconductor device according to claim 49, wherein an insulating film is formed between said first lower electrode and said second lower electrode of said information storage capacitor, and said first lower electrode and said second lower electrode are connected through a contact hole formed in said insulating film.

51. A semiconductor device according to claim 50, wherein said insulating film is an oxide film.

52. A semiconductor device according to claim 49, wherein the dielectric layer of said filter capacitor has a thickness larger than that of said information storage capacitor.

53. A semiconductor according to claim 52, wherein the dielectric layer of said filter capacitor includes an ONO film and an oxide film formed thereon, and the dielectric layer of said information storage capacitor includes an ONO film.

54. A semiconductor device according to claim 36 wherein:

first electrically conducting films, a dielectric layer and a second electrically conducting film are formed in said element forming regions, each of said first conducting films being arranged at the same film-formation-step level as and being separated from said lower electrode of said filtering capacitor, said dielectric layer including said oxide film and a nitride film formed on said first conducting film, said second conducting film being arranged at the same film-formation-step level as and being separated from the upper electrode of said filtering capacitor;

each of said first conducting films serves as a first lower electrode of an information storage capacitor and a second lower electrode is formed on said each first lower electrode so that said first and second lower electrodes cooperate to serve as a lower electrode of said information storage capacitor while said second conducting film serves as an upper electrode of said information storage capacitor, and the lower electrode and the upper electrode of said storage capacitor being arranged opposite to each other across the dielectric layer;

an oxide film is provided on the lower electrode of said filtering capacitor, said dielectric layer is formed on said oxide film, and the upper electrode of said filtering capacitor is formed on the dielectric layer of said filtering capacitor; and an oxide film made of the same material as said oxide film of said filtering capacitor is arranged at the same film-formation-step level as said oxide film of said filtering capacitor and is located between said first lower electrode and said second lower electrode of said information storage capacitor, and said first and second lower electrodes are connected through a contact hole formed in said oxide film for said information storage capacitor.

55. A semiconductor device according to claim 36, wherein first electrically conducting films, a dielectric layer, a second electrically conducting film are formed in said element forming regions, said first conducting films being made of the same material as that of and being separated from said lower electrode of said filtering capacitor, said dielectric layer being formed on said first conducting films and including an oxide film and a nitride film, and said second conducting film being made of the same material as that of and being separated from said upper electrode of said filtering capacitor.

56. A semiconductor device according to claim 55, wherein each of said first conducting films serves as a lower electrode of an information storage capacitor and said second conducting film serves as an upper electrode of said information storage capacitor, the lower electrode of said information storage capacitor and the upper electrode of said storage capacitor are arranged opposite to each other across said dielectric layer, said filtering capacitor having a breakdown voltage higher than that of said information storage capacitor.

57. A semiconductor device according to claim 56, wherein said dielectric layer is an ONO film.

58. A semiconductor device according to claim 56, wherein transfer gate transistors are formed in said element forming regions, the lower electrode of each of said information storage capacitors is electrically connected to one of a pair of source/drain regions of said transfer gate transistor.

59. A semiconductor device according to claim 56, wherein the dielectric layer of said filter capacitor has a thickness larger than that of said information storage capacitor.

60. A semiconductor according to claim 59, wherein the dielectric layer of said filter capacitor includes an ONO film and an oxide film formed thereon, and the dielectric layer of said information storage capacitor includes an ONO film.

61. A semiconductor device according to claim 55, wherein each of said first conducting films serves as a floating gate of a non-volatile memory cell transistor, said second conducting film is patterned to provide a control gate of said non-volatile memory cell transistor, and said floating gate and said control gate are arranged opposite to each other across said dielectric layer.

62. A semiconductor device according to claim 61, wherein said dielectric layer is an ONO film.

63. A semiconductor device according to claim 55, wherein the lower electrode of said filter capacitor and said first conducting films include the same material, the upper electrode of said filtering capacitor and said second conducting film include the same material, and said dielectric layer of said filtering capacitor and said dielectric layer of said storage capacitor include the same material.

64. A semiconductor device according to claim 55, wherein each of said first conducting films serves as a first lower electrode of an information storage capacitor, a second lower electrode is formed on each of said first lower electrodes to cooperate therewith, said second conducting film serves as an upper electrode of said information storage capacitor, and said second lower electrode and said upper electrode of said information storage capacitor are arranged opposite to each other across said dielectric layer.

65. A semiconductor device according to claim 64, wherein an insulating film is formed between said first lower electrode and said second lower electrode of said information storage capacitor, and said first lower electrode and said second lower electrode are connected through a contact hole formed in said insulating film.

66. A semiconductor device according to claim 65, wherein said insulating film is an oxide film.

67. A semiconductor device according to claim 64, wherein the dielectric layer of said filter capacitor has a thickness larger than that of said information storage capacitor.

68. A semiconductor according to claim 67, wherein the dielectric layer of said filter capacitor includes an ONO film and an oxide film formed thereon, and the dielectric layer of said information storage capacitor includes an ONO film.

* * * * *